United States Patent
Dong et al.

(10) Patent No.: US 9,576,959 B1
(45) Date of Patent: Feb. 21, 2017

(54) SEMICONDUCTOR DEVICE HAVING FIRST AND SECOND GATE ELECTRODES AND METHOD OF MANUFACTURING THE SAME

(71) Applicants: Yaoqi Dong, Suwon-si (KR); Mun Hyeon Kim, Seoul (KR); Keun Hwi Cho, Seoul (KR); Shigenobu Maeda, Seongnam-si (KR); Han Su Oh, Yongin-si (KR)

(72) Inventors: Yaoqi Dong, Suwon-si (KR); Mun Hyeon Kim, Seoul (KR); Keun Hwi Cho, Seoul (KR); Shigenobu Maeda, Seongnam-si (KR); Han Su Oh, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/010,327

(22) Filed: Jan. 29, 2016

(30) Foreign Application Priority Data

Sep. 16, 2015 (KR) ........................ 10-2015-0131151

(51) Int. Cl.
| | |
|---|---|
| *H01L 29/94* | (2006.01) |
| *H01L 31/113* | (2006.01) |
| *H01L 21/00* | (2006.01) |
| *H01L 21/8238* | (2006.01) |
| *H01L 27/092* | (2006.01) |
| *H01L 29/08* | (2006.01) |
| *H01L 29/161* | (2006.01) |
| *H01L 29/165* | (2006.01) |
| *H01L 29/49* | (2006.01) |
| *H01L 29/78* | (2006.01) |
| *H01L 23/535* | (2006.01) |

(52) U.S. Cl.
CPC ......... *H01L 27/0922* (2013.01); *H01L 23/535* (2013.01); *H01L 27/0924* (2013.01); *H01L 29/0847* (2013.01); *H01L 29/161* (2013.01); *H01L 29/165* (2013.01); *H01L 29/4966* (2013.01); *H01L 29/7848* (2013.01)

(58) Field of Classification Search
CPC ............ H01L 29/66795; H01L 29/785; H01L 21/845; H01L 27/1211; H01L 27/0886; H01L 27/0924; H01L 27/10879; H01L 29/41791; H01L 27/10826; H01L 29/6656; H01L 29/7827; H01L 29/66666; H01L 29/78642
See application file for complete search history.

(56) References Cited

U.S. PATENT DOCUMENTS 7,385,237 B2 * 6/2008 Lee .................. H01L 29/66795
 257/213
8,258,587 B2 9/2012 Masuoka et al.
(Continued)

*Primary Examiner* — Hsien Ming Lee
(74) *Attorney, Agent, or Firm* — Harness, Dickey & Pierce, P.L.C.

(57) ABSTRACT

Provided is a semiconductor device having first and second gate electrodes. The semiconductor device includes a substrate, an active region extending in a first direction on the substrate, a first gate electrode crossing the active region and extending in a second direction, and a second gate electrode extending in the second direction on the first gate electrode, wherein the first gate electrode has a first width in the first direction, and wherein the second gate electrode has a second width in the first direction, the second width being less than the first width.

19 Claims, 18 Drawing Sheets

(56) References Cited

U.S. PATENT DOCUMENTS

| | | |
|---|---|---|
| 8,329,546 B2 | 12/2012 | Lee et al. |
| 8,426,300 B2 | 4/2013 | Ramachandran et al. |
| 8,722,491 B2 | 5/2014 | Park et al. |
| 8,735,270 B2 | 5/2014 | Hempel et al. |
| 8,945,952 B2 | 2/2015 | Foster |
| 9,018,711 B1 | 4/2015 | Cai et al. |
| 9,070,625 B2 * | 6/2015 | Fitzsimmons et al. |
| 2005/0194616 A1 * | 9/2005 | Yoon .................... H01L 29/785 257/213 |
| 2010/0059833 A1 | 3/2010 | Yu et al. |
| 2011/0018072 A1 | 1/2011 | Lin et al. |
| 2012/0064679 A1 | 3/2012 | Yu et al. |
| 2012/0086048 A1 | 4/2012 | Park et al. |
| 2015/0091089 A1 | 4/2015 | Niebojewski et al. |
| 2015/0145057 A1 | 5/2015 | Fan et al. |

* cited by examiner

SEMICONDUCTOR DEVICE HAVING FIRST AND SECOND GATE ELECTRODES AND METHOD OF MANUFACTURING THE SAME

CROSS-REFERENCE TO RELATED APPLICATIONS

This U.S. non-provisional patent application claims priority under 35 U.S.C. §119 to Korean Patent Application No. 10-2015-0131151, filed on Sep. 16, 2015, in the Korean Intellectual Property Office (KIPO), the contents of which are herein incorporated by reference in their entirety.

BACKGROUND

1. Technical Field

Example embodiments of inventive concepts relate to semiconductor devices including first and second gate electrodes and methods of manufacturing the same.

2. Description of the Related Art

Recently, semiconductor devices having a plurality of gate electrodes have become highly integrated. Therefore, a fin field effect transistor (FinFET) having a three-dimensional structure has been researched and developed in order to reduce short channel effects.

SUMMARY

According to example embodiments of inventive concepts, a semiconductor device includes a substrate, an active region extending in a first direction on the substrate, a first gate electrode on the substrate, and a second gate electrode on the first gate electrode. The first gate electrode crosses the active region and extends in a second direction. The second gate electrode extends in the second direction. The first gate electrode has a first width in the first direction. The second gate electrode has a second width in the first direction. The second width is less than the first width.

In example embodiments, the first gate electrode may include a different material than a material of the second gate electrode.

In example embodiments, the second gate electrode may include a material having a resistivity that is less than a resistivity of the first gate electrode.

In example embodiments, the semiconductor device may further include a first spacer on the first gate electrode. The first spacer may be positioned at both sides of the second gate electrode.

In example embodiments, the semiconductor device may further include a second spacer positioned at both sides of the first gate electrode. The second spacer may extend along a sidewall of the first spacer.

In example embodiments, an inner sidewall of the second spacer may extend upwardly from an upper surface of the active region without bending.

In example embodiments, the first spacer may have a dielectric constant that is less than a dielectric constant of the second spacer.

In example embodiments, the semiconductor device may further include a gate dielectric layer covering the both sides of the first gate electrode. A bottom of the first gate electrode may be on the gate dielectric layer.

In example embodiments, an uppermost surface of the gate dielectric layer may be below the second gate electrode.

In example embodiments, the semiconductor device may further include a first spacer on an upper surface of the first gate electrode and a second spacer on the substrate. The first spacer may be positioned at both sides of the second gate electrode between the second spacer and the second gate electrode. A portion of the gate dielectric layer may be between the second spacer and the first gate electrode. An uppermost surface of the gate dielectric layer may contact a bottom of the first spacer.

In example embodiments, the first gate electrode may include a first conductive layer and a second conductive layer. The first conductive layer may include a first portion and a second portion. The first portion may extend parallel to an upper surface of the substrate. The second portion may extend in a vertical direction from the upper surface of the substrate.

In example embodiments, at least one of the first and second conductive layers may have a line shape extending in a direction.

In example embodiments, the second gate electrode may include substantially the same material as at least one of the first and second conductive layers.

In example embodiments, the semiconductor device may further include a source/drain region on the active region at both sides of the first and second gate electrodes. The source/drain region may include a silicon germanium epitaxial layer. The semiconductor device may further include a contact plug on the source/drain region.

In example embodiments, the active region may include a fin-type active region.

According to example embodiments of inventive concepts, a semiconductor device includes a substrate having an active region, a gate electrode crossing the active region on the substrate, and a first spacer. The gate electrode may include a first gate electrode on the active region, and a second gate electrode on the first gate electrode. The second gate electrode has a width that is less than a width of the first gate electrode. The first spacer is on an upper surface of the first gate electrode. The first spacer is positioned at both sides of the second gate electrode.

In example embodiments, the semiconductor device may further include a second spacer positioned at both sides of the gate electrode. The first spacer may be between the second gate electrode and the second spacer.

According to example embodiments of inventive concepts, a semiconductor device includes a substrate having an active region, a first gate electrode on the active region, a gate dielectric layer between the active region and the first gate electrode, a second gate electrode on the first gate electrode, and a first spacer positioned at a sidewall of the second gate electrode. The first spacer is on an upper portion of the first gate electrode. A portion of the gate dielectric layer extends along a sidewall of the first gate electrode, In example embodiments, a bottom surface of the first spacer may contact an upper surface of the gate dielectric layer.

In example embodiments, the semiconductor device may further include a second spacer on the substrate at a sidewall of the first spacer. A lower portion of the second spacer may contact a sidewall of the gate dielectric layer. The first gate electrode may have a first width. The second gate electrode may have a second width that is less than the first width.

According to example embodiments of inventive concepts, a method of manufacturing a semiconductor device includes forming an insulating layer having an opening on a substrate, forming a conductive line in the opening by filling the opening with a conductive material, forming a first gate electrode by removing an upper portion of the conductive line, and forming a second gate electrode on an upper surface of the first gate electrode. A width of the second gate electrode may less than a width of the first gate electrode.

In example embodiments, the first gate electrode may include a different material than the second gate electrode.

In example embodiments, the method may further include forming a gate dielectric layer on an inner sidewall of the opening and on the substrate before the forming the conductive line. The forming the gate dielectric layer may include removing upper portion of the gate dielectric layer.

In example embodiments, the method may further include forming a first spacer on an inner sidewall of the opening and on the first gate electrode. A bottom of the first spacer may contact an uppermost surface of the gate dielectric layer.

In example embodiments, the forming the insulating layer may include forming a sacrificial gate structure on the substrate, forming a dielectric layer on the sacrificial gate structure, planarizing the dielectric layer to expose an upper surface of the sacrificial gate structure, and removing the sacrificial gate structure to expose an upper surface of the substrate.

In example embodiments, the method may further include forming a device isolation region on the substrate. The device isolation region may define a fin-type active region on the substrate. The fin-type active region may cross the sacrificial gate electrode and may be under the sacrificial gate electrode. The method may further include removing a portion of the fin-type active region at both sides of the sacrificial gate electrode, and forming a source/drain region on the removed upper portion of the fin-type active region.

In example embodiments, the method may further include forming a second spacer on the substrate at both sides of the sacrificial gate electrode before the forming the dielectric layer, and forming a interlayer dielectric layer on the source/drain region.

In example embodiments, the second spacer may contact the gate dielectric layer and the first spacer. A portion of the gate dielectric layer may be between the first gate electrode and the second spacer.

According to example embodiments of inventive concepts, a semiconductor device includes a substrate, an active region extending in a first direction on the substrate, a first gate electrode on the active region, a gate dielectric layer between the first gate electrode and the active region, a first spacer, and a second gate electrode. The active region is one of formed on the substrate and defined by trenches formed in the substrate. The first gate electrode extends in a second direction that crosses the first direction. The first spacer includes two first spacer structures on top of an upper surface of the first gate electrode and spaced apart from each other in the first direction. The second gate electrode is on the first gate electrode between the two first spacer structures.

In example embodiments, the semiconductor device may further include a second spacer on the active region. The second spacer may include two second spacer structures spaced apart from each other in the first direction. The first spacer structures, the gate dielectric layer, the first gate electrode, and the second gate electrode may be between the two second spacer structures.

In example embodiments, a dielectric constant of the first spacer may be less than a dielectric constant of the second spacer.

In example embodiments, the two first spacer structures may be in direct contact with an upper surface of the gate dielectric layer, or the two first spacer structures may be in direct contact with a side surface of the gate dielectric layer.

In example embodiments, the active region may include a fin-type active region.

BRIEF DESCRIPTION OF THE DRAWINGS

The above aspects and features of inventive concepts will become more apparent by describing in detail example embodiments thereof with reference to the attached drawings, in which.

DETAILED DESCRIPTION

Figure 1:
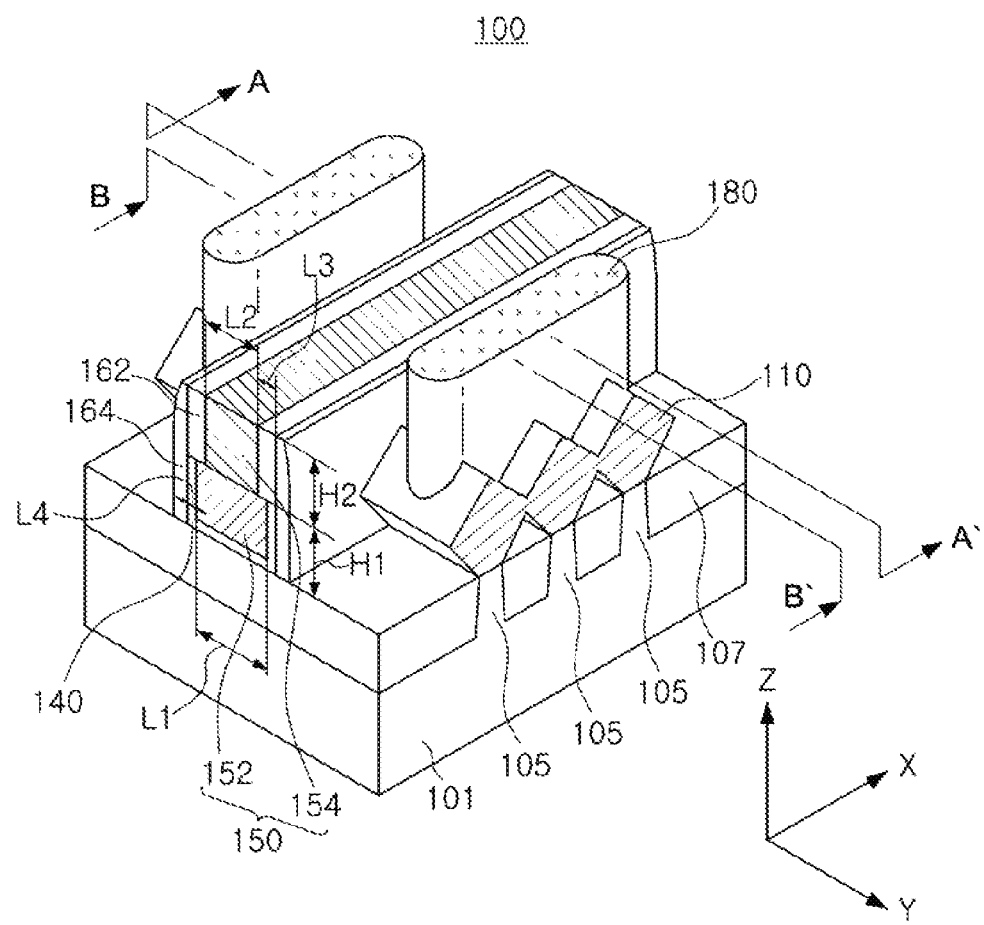
FIG. 1 is a perspective view illustrating a semiconductor device according to example embodiments of inventive concepts.

Example embodiments of inventive concepts will now be described more fully hereinafter with reference to the accompanying drawings; however, they may be embodied in different forms and should not be construed as limited to the example embodiments set forth herein.

It will be understood that when an element is referred to as being "on," "connected" or "coupled" to another element, it can be directly on, connected or coupled to the other element or intervening elements may be present. In contrast, when an element is referred to as "contacting," or being "directly on," "directly connected" or "directly coupled" to another element, there are no intervening elements present. Other words used to describe the relationship between elements or layers should be interpreted in a like fashion (e.g., "between" versus "directly between," "adjacent" versus "directly adjacent," "under" versus "directly under").

It will be understood that, although the terms "first", "second", etc., may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section. Thus, a first element, component, region, layer or section discussed below could be termed a second element, component, region, layer or section without departing from the teachings of example embodiments.

In the drawing figures, the dimensions of layers and regions may be exaggerated for clarity of illustration. Like reference numerals refer to like elements throughout. The same reference numbers indicate the same components throughout the specification.

Spatially relative terms, e.g., "beneath," "below," "lower," "above," "upper" and the like, may be used herein for ease of description to describe the relationship of one element or feature to another element(s) or feature(s), as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. Expressions such as "at least one of," when preceding a list of elements, modify the entire list of elements and do not modify the individual elements of the list.

As used herein, the term "and/or" includes any and all combinations of one or more of the associated listed items. The use of the terms "a" and "an" and "the" and similar referents in the context of describing embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to") unless otherwise noted.

Unless defined otherwise, all technical and scientific terms used herein have the same meaning as commonly understood by one of ordinary skill in the art. It is noted that the use of any and all examples, or example terms provided herein is intended merely to better illuminate the example embodiments and is not a limitation on the scope of inventive concepts unless otherwise specified.

Example embodiments will be described with reference to perspective views, cross-sectional views, and/or plan views. The profile of an example view may be modified according to, e.g., manufacturing techniques and/or allowances. Accordingly, the example embodiments are not intended to limit the scope, but cover all changes and modifications that can be caused due to, e.g., a change in manufacturing process. Thus, regions shown in the drawings are illustrated in schematic form and the shapes of the region are presented simply by way of illustration and not as a limitation.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Hereinafter, example embodiments of inventive concepts will be described in detail with reference to the accompanying drawings.

Figure 2A:
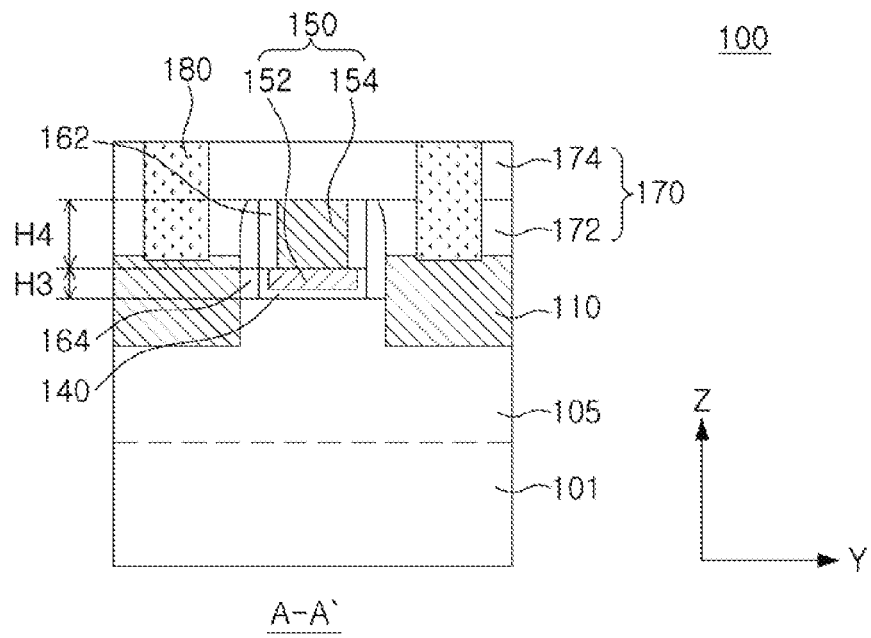
FIGS. 2A and 2B are cross-sectional views taken along the lines A-A' and B-B' of FIG. 1, respectively.
Figure 2B:
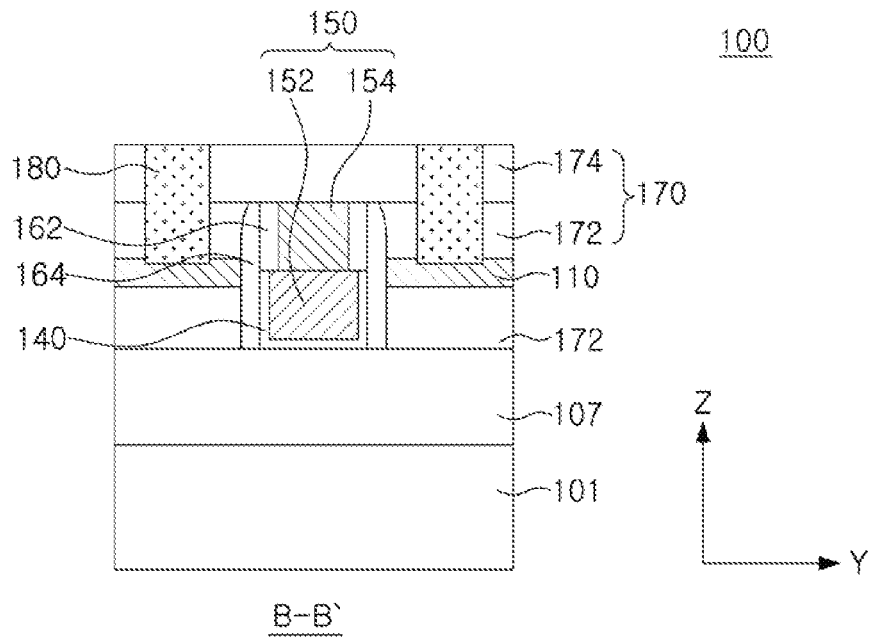

FIG. 1 is a perspective view illustrating a semiconductor device according to example embodiments of inventive concepts. FIGS. 2A and 2B are cross-sectional views taken along the lines A-A' and B-B' of FIG. 1, respectively. For convenience of description, some of elements, for example, an interlayer insulating layer 170 shown in FIGS. 2A and 2B, are omitted in FIG. 1.

Referring to FIGS. 1, 2A, and 2B, a semiconductor device 100 may include a substrate 101, an active region 105, a source/drain region 110, a gate dielectric layer 140, a gate electrode 150, and a contact plug 180. The semiconductor device 100 may further include a device isolation region 107, a first spacer 162, a second spacer 164, and an interlayer insulating layer 170.

In example embodiments, the semiconductor device 100 may include a fin-type field effect transistor (FinFET) having a plurality of fin-type active regions.

The substrate 101 may have an upper surface extending in X-direction and Y-direction. The substrate 101 may include a semiconductor material, e.g., a group IV compound semiconductor, a group III-V compound semiconductor, or a group II-VI silicon-oxide semiconductor. For example, the group IV compound semiconductor may include silicon (Si), germanium (Ge), and/or silicon germanium (SiGe). The substrate 101 may be a bulk silicon wafer, an epitaxial layer, a silicon-on-insulator (SOI) substrate, or a semiconductor-on-insulator (SeOI) substrate.

The device isolation region 107 may define the active region 105 on the substrate 101. The device isolation region 107 may include a dielectric material, e.g., silicon oxide, silicon nitride, or the mixture thereof. The device isolation region 107 may be formed using a shallow trench isolation (STI) process.

The active region 105 may extend in a first direction, e.g., the Y-direction. The active region 105 may be a fin-type active region that is protruding from the substrate 101. In example embodiments, the active region 105 may be a portion of the substrate 101 and/or include an epitaxial layer grown from the substrate 101. The active region 105 may be recessed at both sides of a gate electrode 150.

The source/drain region 110 may be formed at both sides of the gate electrode 150 and on the recessed active region 105. The source/drain region 110 may be provided a source region or a drain region of the semiconductor device 100. The source/drain region 110 may have an elevated structure. Therefore, an upper surface of the source/drain region 110 may be higher than a bottom surface of the gate electrode 150. In example embodiments, the source/drain region 110 may have a pentagonal shape. However, it shall not be restricted or limited thereto. For example, the source/drain region 110 may have a polygonal shape, a circle shape, or a rectangular shape. The source/drain region 110 may have a connected structure or a merged structure that is formed on three active regions. In example embodiments, the source/drain region 110 may do not have a connected structure or a merged structure.

The source/drain region 110 may include silicon (Si) or silicon germanium (SiGe). The source/drain region 110 may be formed of an epitaxial layer. If the source/drain region 110 includes SiGe and a channel region includes Si in a PMOS transistor, the source/drain region 110 may induce a compressive stress into the channel region and thereby a hole mobility may be increased in the channel region of a PMOS transistor. In example embodiments, the source/drain region 110 may have a plurality of regions having different impurities and different impurity concentrations each other.

The gate dielectric layer 140 and the gate electrode 150 crossing the active region 105 may be formed on the fin-type active region. The gate electrode 150 may include a first gate electrode 152 and a second gate electrode 154 which are stacked on each other.

The gate dielectric layer 140 may be disposed between the active region 105 and the first gate electrode 152. A portion of the gate dielectric layer 140 may be extended along both sides of the first gate electrode 152. In example embodiments, the gate dielectric layer 140 may be only formed beneath the first gate electrode 152.

The gate dielectric layer 140 may include an insulating layer, e.g., a silicon oxide layer, a silicon oxynitride layer, a silicon nitride layer, and/or a high-k dielectric layer. The high-k dielectric layer may be an insulating material that has a dielectric constant that is greater than a dielectric constant of silicon oxide. For example, the high-k dielectric layer may include at least one of aluminum oxide ($Al_2O_3$), tantalum oxide ($Ta_2O_3$), Yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide ($LaAl_xO_y$), lanthanum hafnium oxide ($LaHf_xO_y$), hafnium aluminum oxide ($HfAl_xO_y$), and/or praseodymium oxide ($Pr_2O_3$).

The gate electrode 150 may be extended in the X-direction. The first gate electrode 152 may be formed on the gate dielectric layer 140. The second gate electrode 154 may be formed on the first gate electrode 152. A channel region may be formed in an upper portion of the active region 105 that is overlapped by the gate electrode 150. The first spacer 162 includes two first spacer structures at opposite sides of the second gate electrode 154. The second spacer 164 includes two second spacer structures.

The first gate electrode 152 may have a first width L1 in the first direction, e.g., the Y-direction. The second gate electrode 154 may have a second width L2 less than the first width L1 in the first direction.

A contact plug 180 may be formed on the source/drain region 110. In example embodiments, a lower portion of the second gate electrode 154 may have a level that is substantially the same as a bottom of the contact plug 180. Therefore, a parasitic capacitance between the second gate electrode 154 and the contact plug 180 may be reduced by reducing the second width L2 of the second gate electrode 154.

An upper surface of the first gate electrode 152 may have a first height H1 from an upper surface of the substrate 101. An upper surface of the second gate electrode 154 may have a second height H2 from the upper surface of the first gate electrode 152. In example embodiments, an interface between the first gate electrode 152 and the second gate electrode 154 may have a level less than or equal to the bottom surface of the contact plug 180. However, it shall not be restricted or limited thereto.

As shown in FIG. 2A, the upper surface of the first gate electrode 152 may have a third height H3 from an upper surface of the active region 105. The third height H3 may be less than the first height H1. The upper surface of the second gate electrode 154 may have a fourth height H4 from the upper surface of the active region 105. The fourth height H4 may be substantially the same as the second height H2. However, it shall not be restricted or limited thereto.

The first gate electrode 152 may have a different material from the second gate electrode 154. The first gate electrode 152 may include a material having a work-function that is available to form a proper threshold voltage of a transistor. In example embodiments, the first gate electrode 152 may include a titanium nitride (TiN) layer, a titanium aluminum carbide (TiAlC) layer, and/or a tungsten (W) layer. The second gate electrode 154 may include a material having a lower resistivity. The second gate electrode 154 may include aluminum (Al), tungsten (W), copper (Cu), and/or molybdenum (Mo). A resistivity of the second gate electrode 154 may be less than a resistivity of the first gate electrode 152. Each of the first and second gate electrodes 152 and 154 may include a plurality of conductive layers, respectively.

A first spacer 162 and a second spacer 164 may be formed on both sides of the gate electrode 150. The gate electrode 150 may be isolated from the source/drain region 110 by the first and second spacers 162 and 164.

In example embodiments, the first spacer 162 may be formed both sides of the second gate electrode 154. The first spacer 162 may be formed on the gate dielectric layer 140 and the first gate electrode 152. A portion of the first spacer 162 may be formed on an upper portion of the first gate electrode 152 because the second width L2 of the second gate electrode 154 is less than the first width L1 of the first gate electrode 152. The second spacer 164 may be formed on both sides of the first and second gate electrodes 152 and 154. The second spacer 164 may be formed along a sidewall of the gate dielectric layer 140 and a sidewall of the first spacer 162. An inner sidewall of the second spacer 164 may be extended upwardly from an upper surface of the active region without bending.

Each of the first and second spacers 162 and 164 may include silicon oxide, silicon nitride, and/or silicon oxynitride, respectively. The first spacer 162 or the second spacer 164 may be formed of a low-k dielectric layer to reduce a capacitance between the gate electrode 150 and the contact plug 180. For example, the first and second spacers 162 and 164 may include polyimide, poly arylene ether (PAE), SiLK™ (a dielectric resin introduced by Dow Chemical), hydrogen silsesquioxane (HSQ), methyl silsesquioxane (MSQ), BLACK DIAMOND™ (SiOC:H, a silica-based material introduced by Applied Materials that is obtained by doping silica with —$CH_3$ groups) and/or fluorine-doped silicate glass (FSG).

According to example embodiments of inventive concepts, a shortage between the second gate electrode 154 and the contact plug 180 may be reduced by reducing the second width L2 of the second gate electrode 154.

The contact plug 180 may be formed on the source/drain region 110 and electrically connected to a conductive line (not shown in figures) for transferring electrical signals to the source/drain region 110. The contact plug 180 may have a bar shape extending in the first direction or an elliptical shape.

The contact plug 180 may pass through the interlayer insulating layer 170 and contact to the source/drain region 110. In example embodiments, an upper portion of the source/drain region 110 may have a recessed region and a bottom of the contact plug 180 may be disposed in the recessed portion. However, it shall not be restricted or limited thereto.

A lower portion of the contact plug 180 may have a diffusion barrier layer or a silicide layer. In example embodiments, the contact plug 180 may contact a silicide layer that is formed on an upper portion of the source/drain region 110. The contact plug 180 may include a conductive material, e.g., titanium nitride (TiN), tantalum nitride (TaN), tungsten nitride (WN), aluminum (Al), copper (Cu), tungsten (W), or molybdenum (Mo).

The interlayer insulating layer 170 may include a first interlayer insulating layer 172 and a second interlayer insulating layer 174. The interlayer insulating layer 170 may be formed on the substrate 101, the source/drain region 110, and the gate electrode 150. An upper surface of the first interlayer insulating layer 172 may be substantially coplanar with an upper surface of the gate electrode 150.

The first and second interlayer insulating layer 172 and 174 may include a silicon oxide layer, a silicon nitride layer, and/or a silicon oxynitride layer. In example embodiments, the first interlayer insulating layer 172 may include a low-k dielectric layer. The first interlayer insulating layer 172 and the second interlayer insulating layer 174 may be formed of different materials.

FIGS. 3 through 6 are cross-sectional views illustrating a semiconductor device according to example embodiments of inventive concepts.

Figure 3:
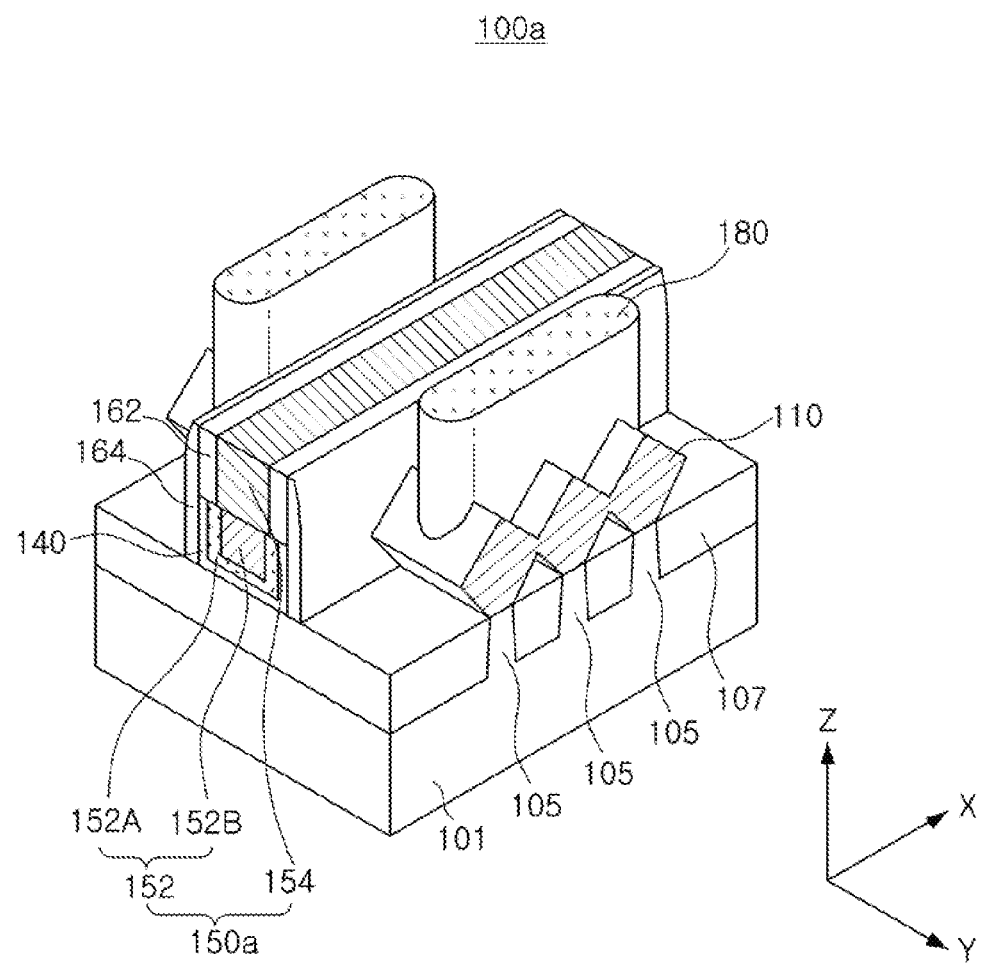
FIGS. 3 through 6 are cross-sectional views illustrating a semiconductor device according to example embodiments of inventive concepts.

Referring to FIG. 3, a semiconductor device 100a may include a substrate 101, a plurality of fin-type active regions 105, a plurality of source/drain regions 110, a gate dielectric layer 140, a gate electrode 150a, and a plurality of contact plugs 180. The semiconductor device 100 may further include a device isolation region 107, a first spacer 162, and a second spacer 164.

The gate electrode 150a may include a first gate electrode 152 and a second gate electrode 154. The gate electrode 150a may be formed on the gate dielectric layer 140.

The first gate electrode 152 may include a first conductive layer 152A and a second conductive layer 152B. The first conductive layer 152A may be formed directly on the gate dielectric layer 140. The first conductive layer 152A may be formed beneath and on both sides of the second conductive layer 152B. In example embodiments, an upper surface of the second conductive layer 152B may be substantially coplanar with an uppermost surface of the gate dielectric layer 140.

The second gate electrode 154 may be formed on the first conductive layer 152A and the second conductive layer 152B. The second gate electrode 154 may have a width less than a width of the first gate electrode 152. The second gate electrode 154 may have a width greater than a width of the second conductive layer 152B. However, it shall not be restricted or limited thereto.

The first gate electrode 152 may include a different material from the second gate electrode 154. The second conductive layer 152B may include a material having a resistivity less than a resistivity of the first conductive layer 152A. The second gate electrode 154 may include a material having a resistivity less than a resistivity of at least one of the first conductive layer 152A and a second conductive layer 152A.

Figure 4:
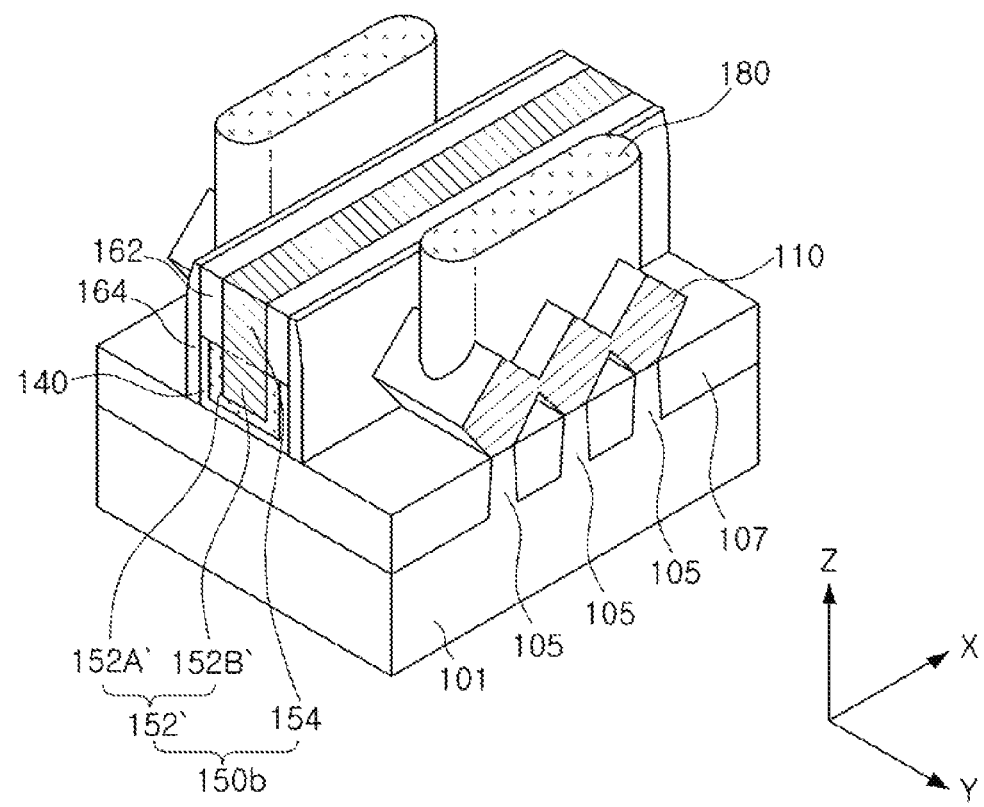

Referring to FIG. 4, a semiconductor device 100b may include a substrate 101, a plurality of fin-type active regions 105, a plurality of source/drain regions 110, a gate dielectric layer 140, a gate electrode 150b, and a plurality of contact plugs 180. The semiconductor device 100b may further include a device isolation region 107, a first spacer 162, and a second spacer 164.

The gate electrode 150b may include a first gate electrode 152 and a second gate electrode 154. The gate electrode 150b may be formed on the gate dielectric layer 140.

The first gate electrode 152 may include a first conductive layer 152A' and a second conductive layer 152B'. The first conductive layer 152A' may be formed directly on the gate dielectric layer 140. The first conductive layer 152A' may be formed beneath and on both sides of the second conductive layer 152B'. In example embodiments, an upper surface of the second conductive layer 152B' may be substantially coplanar with an uppermost surface of the gate dielectric layer 140.

The second gate electrode 154 may be formed on the first conductive layer 152A' and the second conductive layer 152B'. The second gate electrode 154 may have a width less than a width of the first gate electrode 152. The second gate electrode 154 may have a width substantially equal to a width of the second conductive layer 152B'. The second gate electrode 154 may be formed of a conductive material that is substantially the same as the second conductive layer 152B'. However, it shall not be restricted or limited thereto.

The first conductive layer 152A' may include a different material from the second conductive layer 152B'. The second conductive layer 152B' and/or the second gate electrode 154 may include a material having a resistivity less than that of the first conductive layer 152A'.

Figure 5:
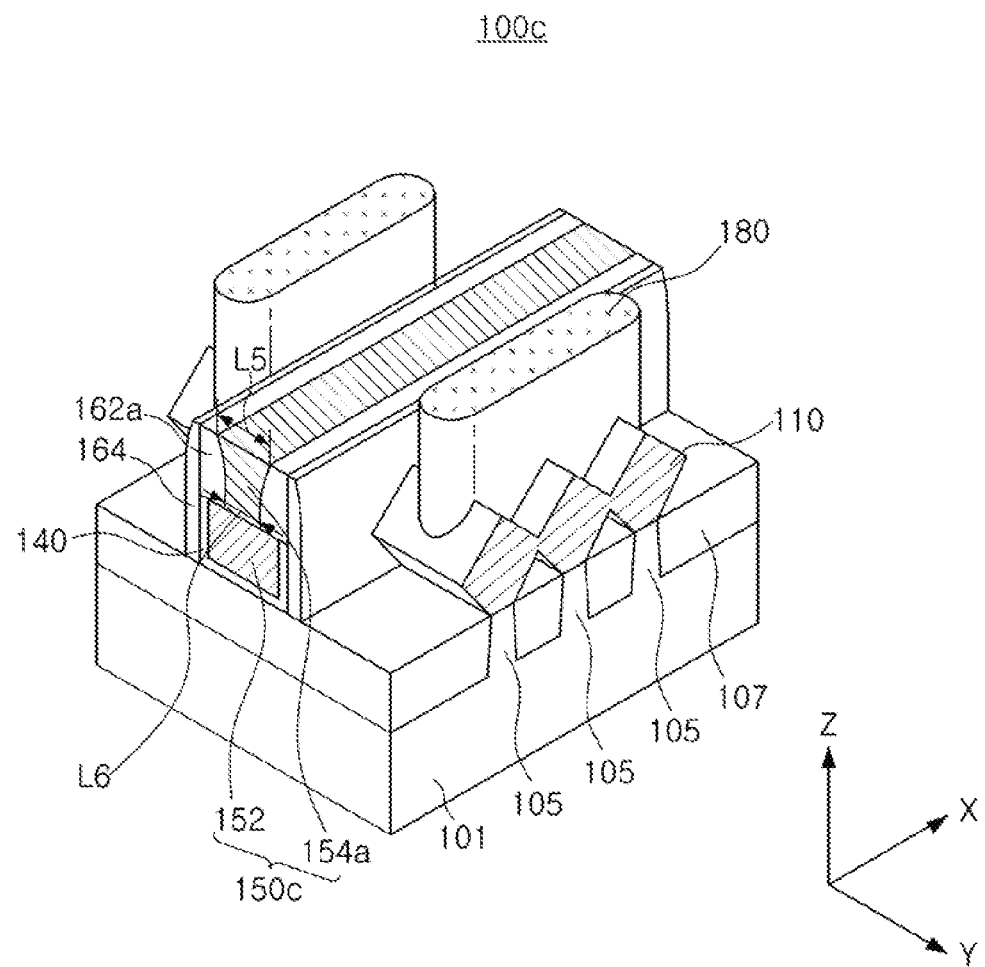

Referring to FIG. 5, a semiconductor device 100c may include a substrate 101, a plurality of fin-type active regions 105, a plurality of source/drain regions 110, a gate dielectric layer 140, a gate electrode 150c, and a plurality of contact plugs 180. The semiconductor device 100c may further include a device isolation region 107, a first spacer 162a, and a second spacer 164.

The gate electrode 150c may include a first gate electrode 152 and a second gate electrode 154a. The gate electrode 150c may be formed on the gate dielectric layer 140.

In example embodiments, the first spacer 162a formed on both sides of the second gate electrode 154a may have a curved inner sidewall. As the result, a width L5 of an upper portion of the second gate electrode 154a may be greater than a width L6 of a bottom portion of the second gate electrode 154a.

Figure 6:
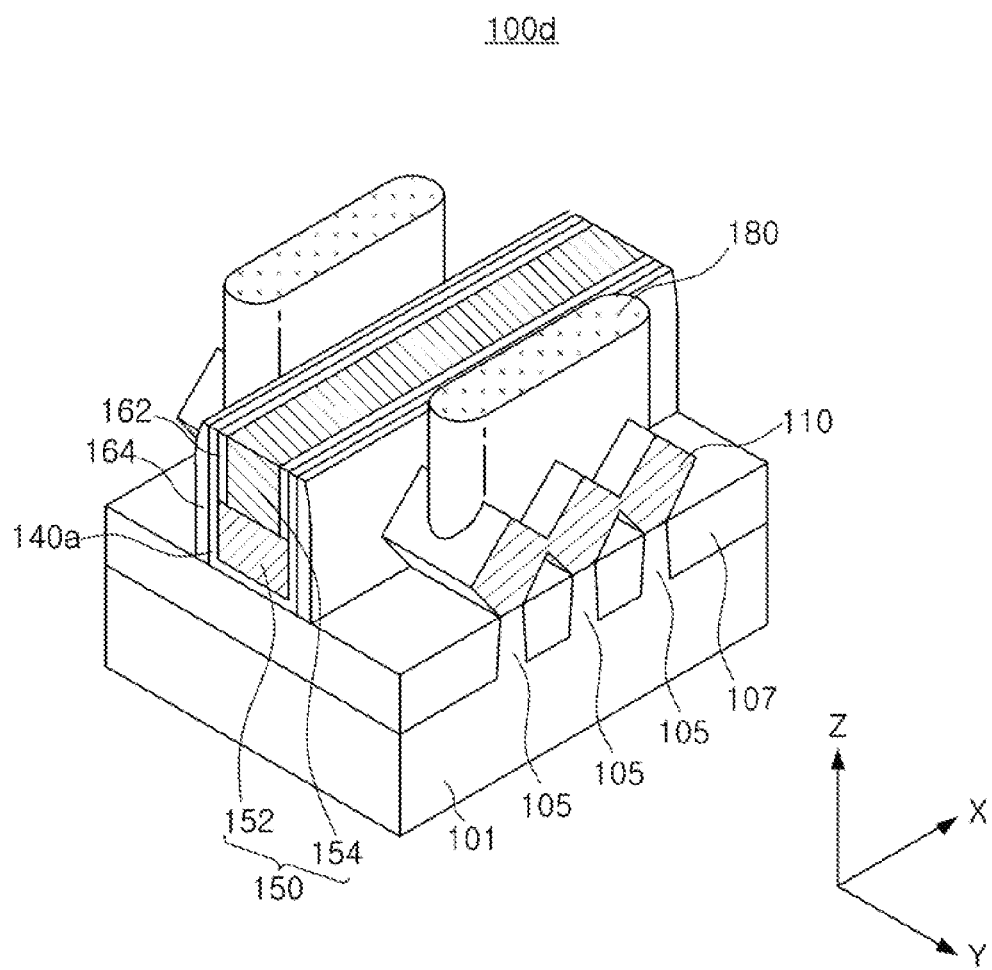

Referring to FIG. 6, a semiconductor device 100d may include a substrate 101, a plurality of fin-type active regions 105, a plurality of source/drain regions 110, a gate dielectric layer 140a, a gate electrode 150, and a plurality of contact plugs 180. The semiconductor device 100d may further include a device isolation region 107, a first spacer 162, and a second spacer 164.

The gate dielectric layer 140a may be formed between the fin-type active region 105 and the first gate electrode 152. In example embodiments, a portion of the gate dielectric layer 140a may be extended along a sidewall of the first spacer 162 that is formed on both sides of the second gate electrode 154. In example embodiments, an uppermost surface of the gate dielectric layer 140a may be substantially coplanar with an upper surface of the second gate electrode 154.

FIGS. 7A through 7L are perspective views illustrating a method of manufacturing a semiconductor device according to example embodiments of inventive concepts.

Figure 7A:
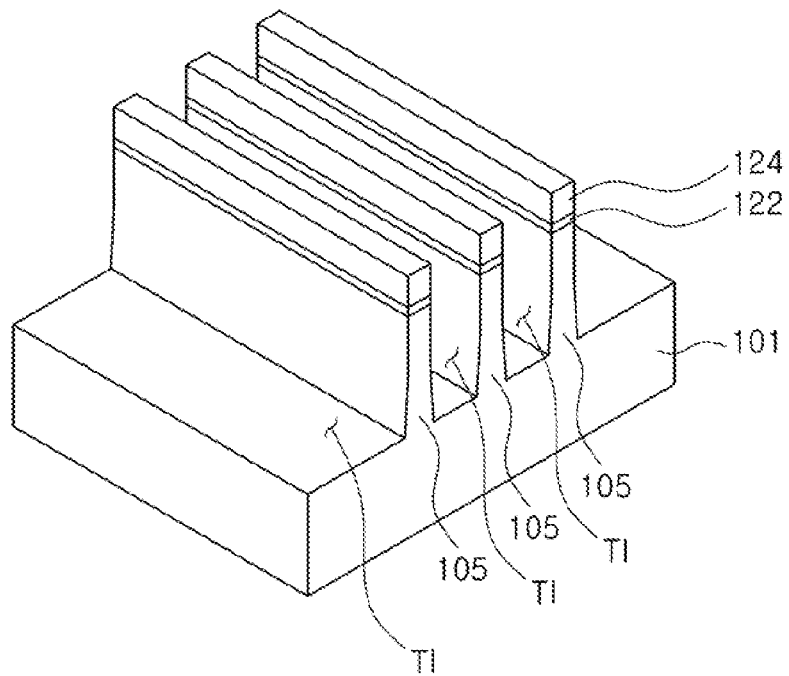
FIGS. 7A through 7L are perspective views illustrating a method of manufacturing a semiconductor device according to example embodiments of inventive concepts.

Referring to FIG. 7A, a plurality of trenches TI may be formed on an upper portion of the substrate 101. The trenches TI may define a plurality of fin-type active region 105.

A pad oxide pattern 122 and a mask pattern 124 may be formed on each of the fin-type active regions 105. The pad oxide pattern 122 and the mask pattern 124 may be used as masks during the formation of the fin-type active regions 105. In example embodiments, the pad oxide pattern 122 and the mask pattern 124 may be omitted. The mask pattern 124 may include silicon oxide, silicon nitride, and/or carbide mixture. The mask pattern 124 may include multiple layers.

In example embodiments, the trenches TI may be formed by etching the substrate 101 using an anisotropic etching process. The trenches TI may have a high aspect ratio. Each of the trenches TI may have variable widths that are gradually reduced from an upper portion to a lower portion thereof. Therefore, each of the fin-type active regions 105 may have variable widths that are gradually reduced from a lower portion to an upper portion thereof.

Figure 7B:
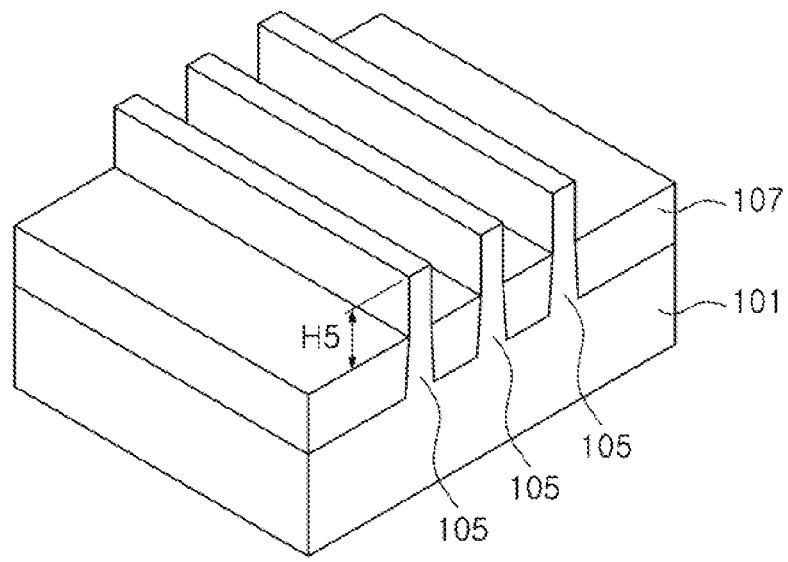

Referring to FIG. 7B, a device isolation region 107 may be formed in the trenches TI. Forming the device isolation region 107 may include forming an insulating layer in the trenches TI and performing a planarization process to the insulating layer. At least a portion of the pad oxide pattern 122 and the mask pattern 124 may be removed during the planarization process. In example embodiments, a thin liner layer may be formed in the trenches TI before forming the insulating layer. The insulating layer may be recessed to expose an upper portion of the fin-type active regions 105 after the planarization process. The insulating layer may be recessed by a wet etching process using the oxide pattern or the mask pattern as an etching mask. As the result, the fin-type active region 105 may be protruded from an upper surface of the device isolation region 107. The oxide pattern 122 and the mask pattern 124 may be removed. The upper surface of the fin-type action regions 105 may have a height H5.

Figure 7C:
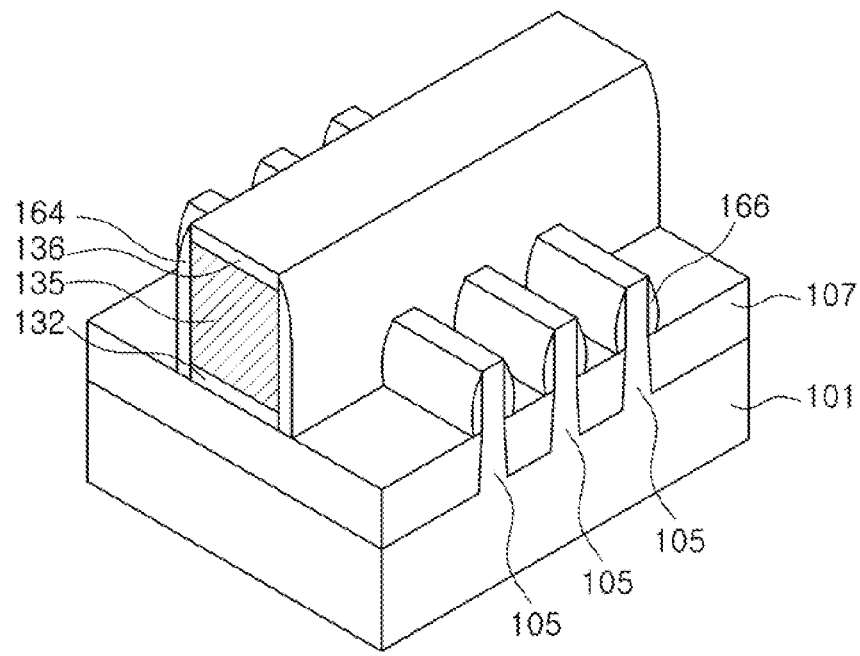

Referring to FIG. 7C, a first sacrificial layer 132 and a second sacrificial layer 135 may be formed on the fin-type active regions 105. The first and second sacrificial layers 132 and 135 may extend in the second direction. In example embodiments, the first and second sacrificial layers 132 and 135 may be formed by an etching process using a mask layer 136 as an etching mask.

The second spacer 164 may be formed on both sides of the first sacrificial layers 132 and the second sacrificial layer 135. The first sacrificial layer 132 may include an insulating layer and the second sacrificial layer 135 may include a conductive layer. However, it shall not be restricted or limited thereto. For example, the first sacrificial layer 132 may include a silicon oxide layer and the second sacrificial layer 135 may include a polysilicon layer. In example embodiments, the first and second sacrificial layers 132 and 135 may be merged and be formed of a single layer.

In example embodiments, the second spacer 164 may be formed on both sides of the first sacrificial layer 132, the second sacrificial layer 135, and the mask layer 136. Forming the second spacer 164 may include forming a dielectric layer on and both sides of the mask layer 136 and the first and second sacrificial layers 132 and 135, and performing an isotropic etching process to the dielectric layer to expose an upper surface of the mask layer 136. In example embodiments, the second spacer 164 may be formed of multiple layers. At this moment, a third spacer 166 may be formed on both sides of the fin-type active regions 105.

Figure 7D:
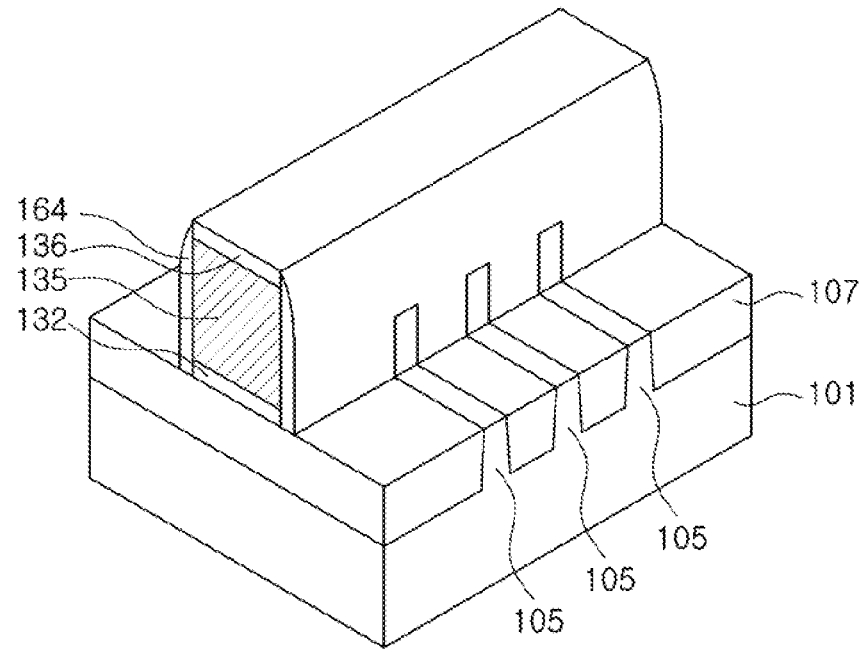

Referring to FIG. 7D, some upper portions of the fin-type active regions 105 may be recessed by an etching process using the mask layer 136 and the second spacer 164 as etching masks. The etching process may include a dry etching process and/or a wet etching process. A curing process may be performed to an upper surface of the recessed fin-type active regions 105. The upper surface of the recessed fin-type active regions 105 may be coplanar with an upper surface of the device isolation region 107. However, it shall not be restricted or limited thereto. In example embodiments, the upper surface of the recessed fin-type active regions 105 may have a level greater than or less than the upper surface of the device isolation region 107.

An impurity doping process may be performed to the recessed fin-type active regions 105 using the mask layer 136 and the second spacer 164 as masks.

Figure 7E:
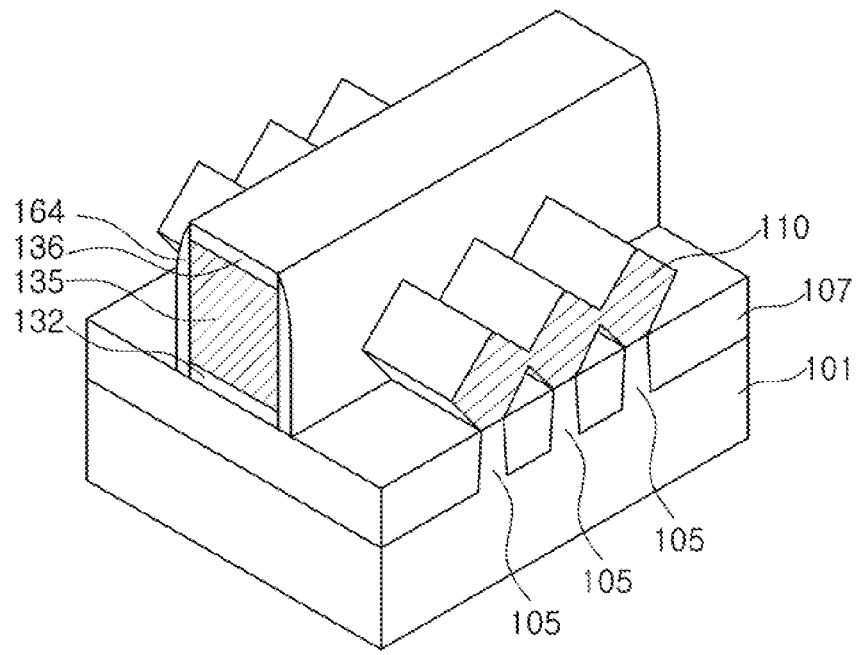

Referring to FIG. 7E, a plurality of source/drain regions 110 may be formed on the recessed fin-type active regions 105 and both sides of the second spacer 164. The source/drain regions 110 may be formed using a selective epitaxial growth (SEG) process. The source/drain regions 110 may include silicon germanium (SiGe).

In example embodiments, the source/drain regions 110 may include several epitaxial layer having different germanium (Ge) concentrations, respectively. Some impurities, e.g., boron (B), may be doped in the source/drain regions 110 during or after the selective epitaxial growth (SEG) process. The source/drain regions 110 may have a pentagonal shape or a hexagonal shape. However, it shall not be restricted or limited thereto. For example, the source/drain regions 110 may have a polygonal shape, a circle shape, or a rectangular shape.

Figure 7F:
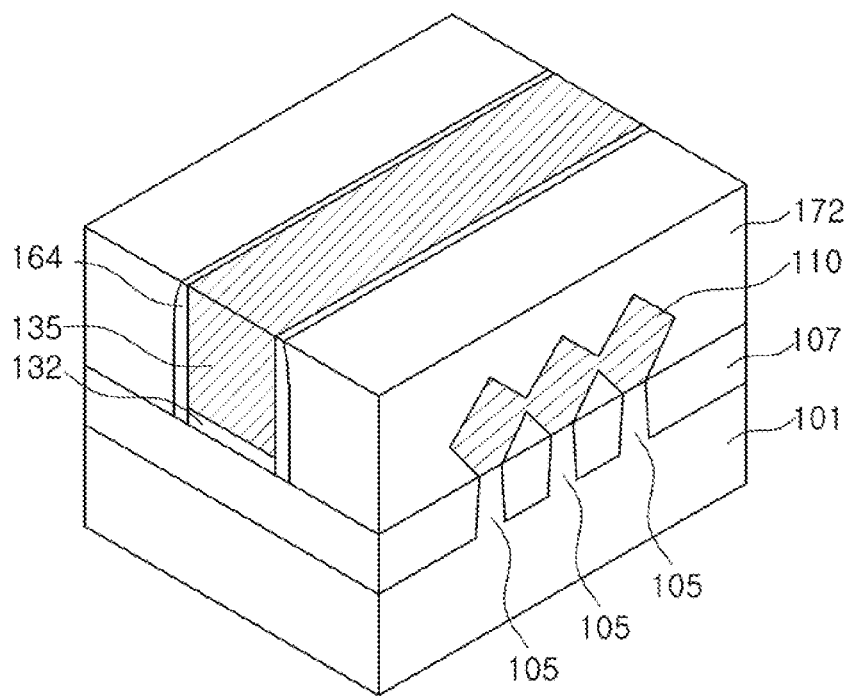

Referring to FIG. 7F, a first interlayer insulating layer 172 may be formed on the source/drain regions 110. Forming the first interlayer insulating layer 172 may include forming an insulating layer on the source/drain regions 110 and performing a planarization process to the insulating layer to expose an upper surface of the second sacrificial layer 135. The mask layer 136 may be removed during the forming the first interlayer insulating layer 172.

The first interlayer insulating layer 172 may include silicon oxide, silicon nitride, and/or silicon oxynitride. In example embodiments, the first interlayer insulating layer 172 may include a low-k dielectric material.

Figure 7G:
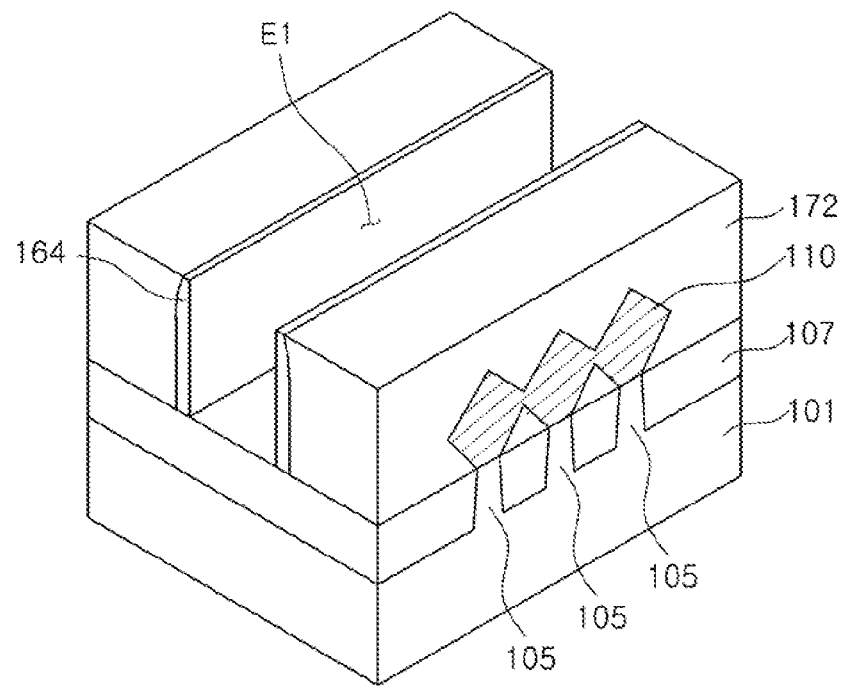

Referring to FIG. 7G, the first and second sacrificial layers 132 and 135 may be removed to form a first opening E1. The first opening may expose an upper surface of the device isolation region 107 and the fin-type active regions 105. The first and second sacrificial layers 132 and 135 may be removed using a wet etching process and/or a dry etching process.

Figure 7H:
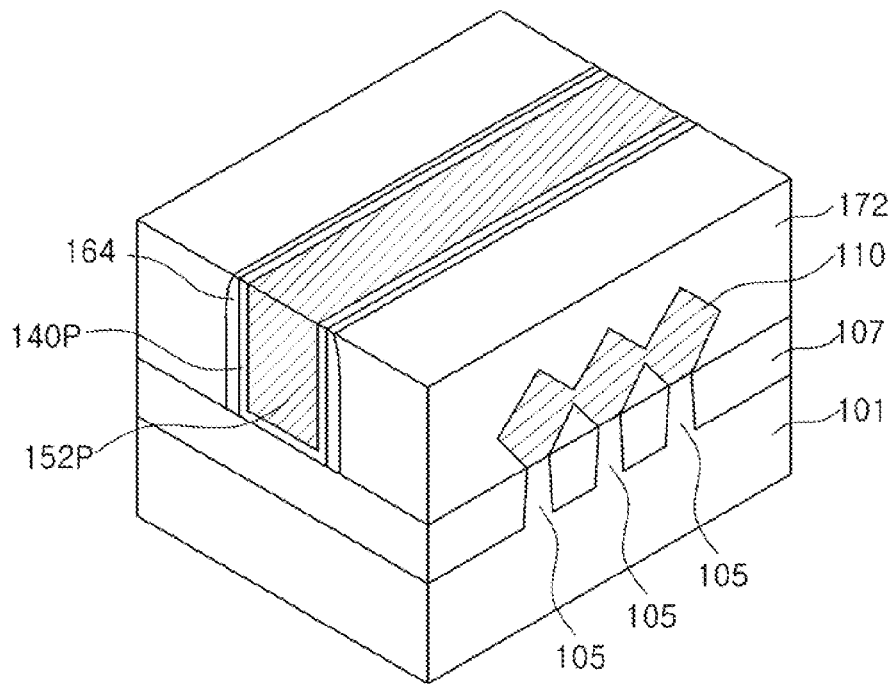

Referring to FIG. 7H, a preliminary gate dielectric layer 140P and a first preliminary gate electrode 152P in the first opening E1. The preliminary gate dielectric layer 140P may be conformally formed along both sidewalls and a bottom of the first opening E1. The preliminary gate dielectric layer 140P may include silicon oxide, silicon nitride, and/or a high-k dielectric material.

The preliminary gate electrode 152P may be formed on the preliminary gate dielectric layer 140P. The preliminary gate electrode 152P may include metal and/or semiconductor material. The preliminary gate electrode 152P may include multiple layers.

The preliminary gate dielectric layer 140P and the first preliminary gate electrode 152P may be planarized to expose an upper surface of the first interlayer insulating layer 172 using a chemical mechanical polishing (CMP) process.

Figure 7I:
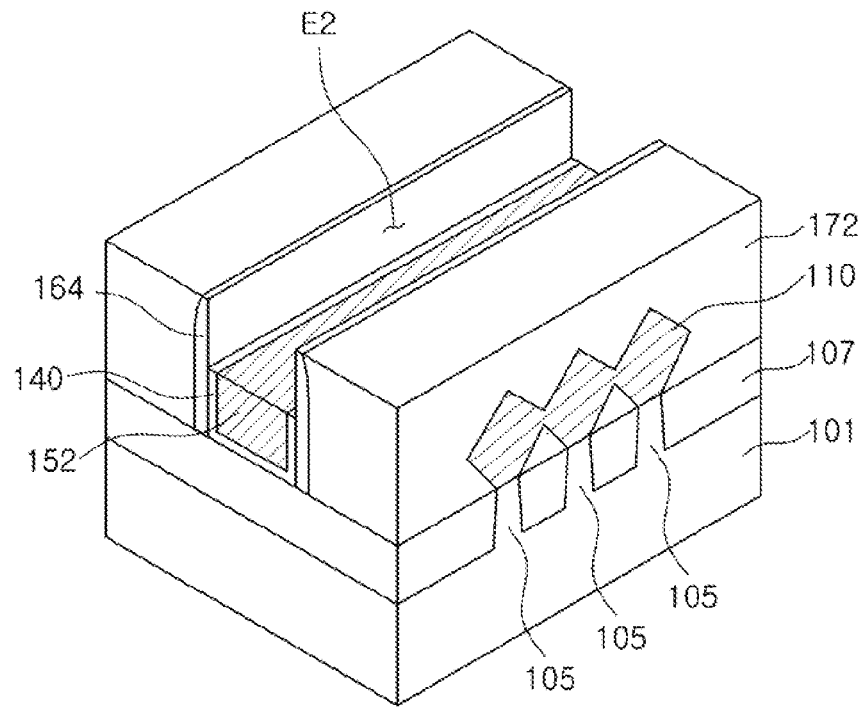

Referring to FIG. 7I, an upper portions of the preliminary gate dielectric layer 140P and the first preliminary gate electrode 152P may be recessed to form the gate dielectric layer 140 and the first gate electrode 152. The preliminary gate dielectric layer 140P and the first preliminary gate electrode 152P may be selectively recessed with respect to the second spacer 164 and the first interlayer insulating layer 172 using a single etching process or multiple etching processes. An upper surface of the gate dielectric layer 140 may be coplanar with an upper surface of the first gate electrode 152. However, it shall not be restricted or limited thereto. For example, the preliminary gate dielectric layer 140P may not be recessed as shown in FIG. 6.

A second opening E2 may be formed after forming the gate dielectric layer 140 and the first gate electrode 152.

Figure 7J:
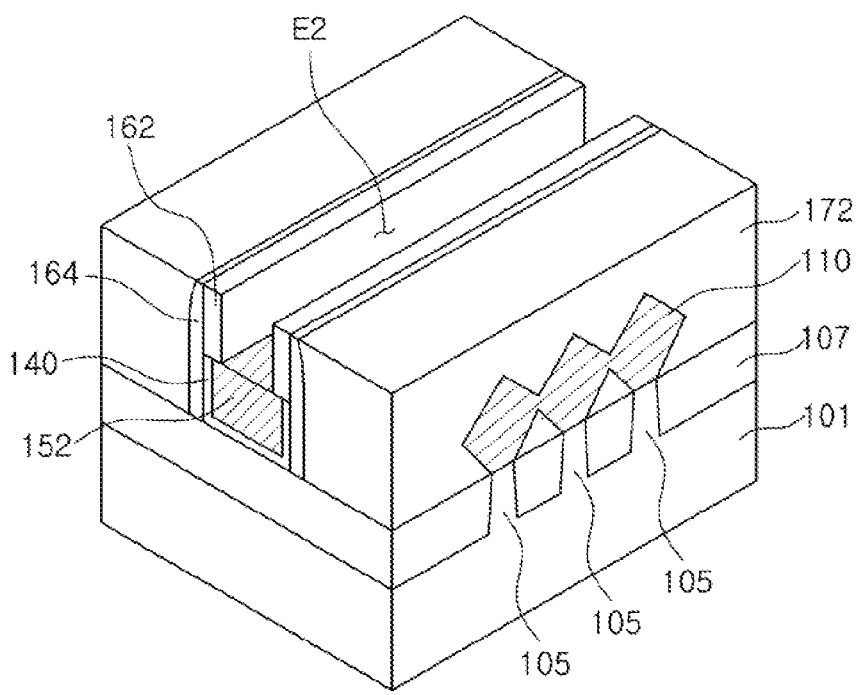

Referring to FIG. 7J, a first spacer 162 may be formed on both sidewalls of the second opening E2. In example embodiments, the first spacer 162 may be formed on the gate dielectric layer 140 and a portion of the first gate electrode 152.

The first spacer 162 may be formed on a sidewall of the second spacer 164 that is exposed by the second opening E2. Forming the first spacer 162 may include forming a dielectric layer on the gate dielectric layer 140, the first gate electrode 152, and the first interlayer insulating layer 172. Forming the first spacer 162 may further include etching the dielectric layer using an isotropic etching process. The first spacer 162 may have a substantially rectangular shape in a cross-sectional view. In example embodiments, a sidewall of the first spacer 162a may have a curved shape as shown in FIG. 5.

Figure 7K:
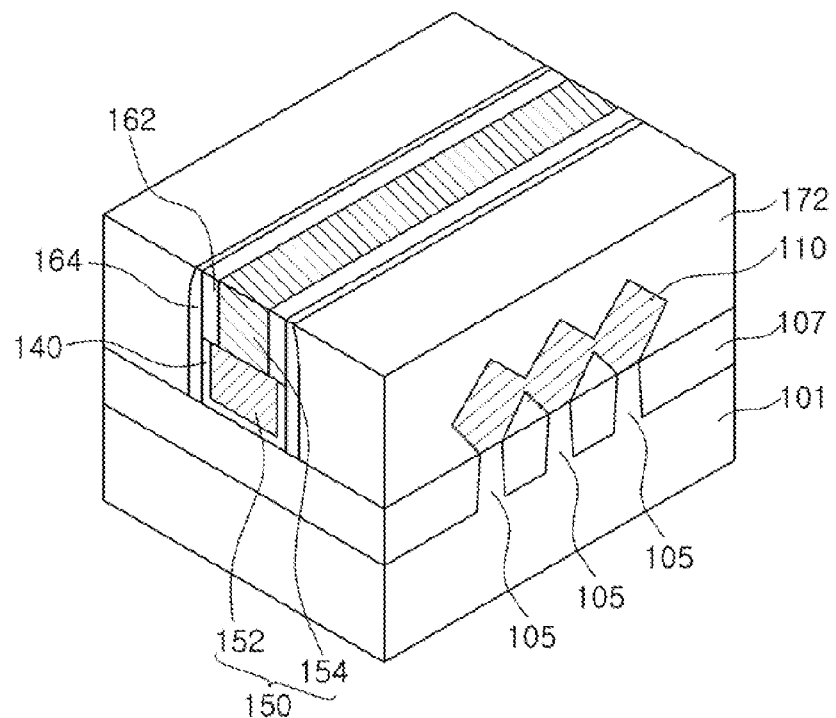

Referring to FIG. 7K, a second gate electrode 154 may be formed in the second opening E2. The second gate electrode 154 may be formed on the first gate electrode 152. Forming the second gate electrode 154 may include forming a conductive layer in the second opening E2 and on the first interlayer insulating layer 172. Forming the second gate electrode 154 may further include performing a planarization process to the conductive layer using a CMP process to expose an upper surface of the first interlayer insulating layer 172.

A width of the first gate electrode 152 may be different from a width of the second gate electrode 154 in a cross-sectional view.

Figure 7L:
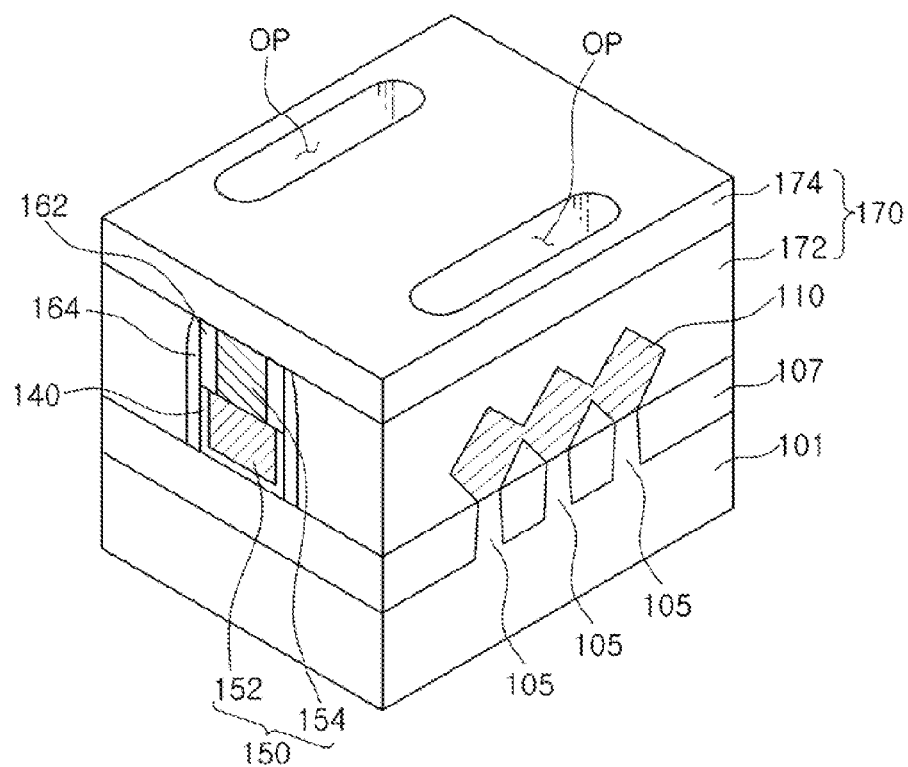

Referring to FIG. 7L, a second interlayer insulating layer 174 may be formed on the first interlayer insulating layer 170 and the second gate electrode 154. A plurality of contact holes OP may be formed in the first and second interlayer insulating layers 172 and 174. The contact holes OP may expose an upper surface of the source/drain regions 110. The upper surface of the source/drain regions 110 may be recessed during the forming the contact holes OP. A bottom portion of the contact holes OP may have a curved shape along an upper surface of the source/drain region 110. The contact holes OP may be filled by a conductive layer to form a plurality of contact plugs 180 as shown in FIG. 1. A silicide layer may be formed between the contact plugs 180 and the source/drain regions 110. In example embodiments, the silicide layer may be a portion of the contact plugs 180.

Figure 8A:
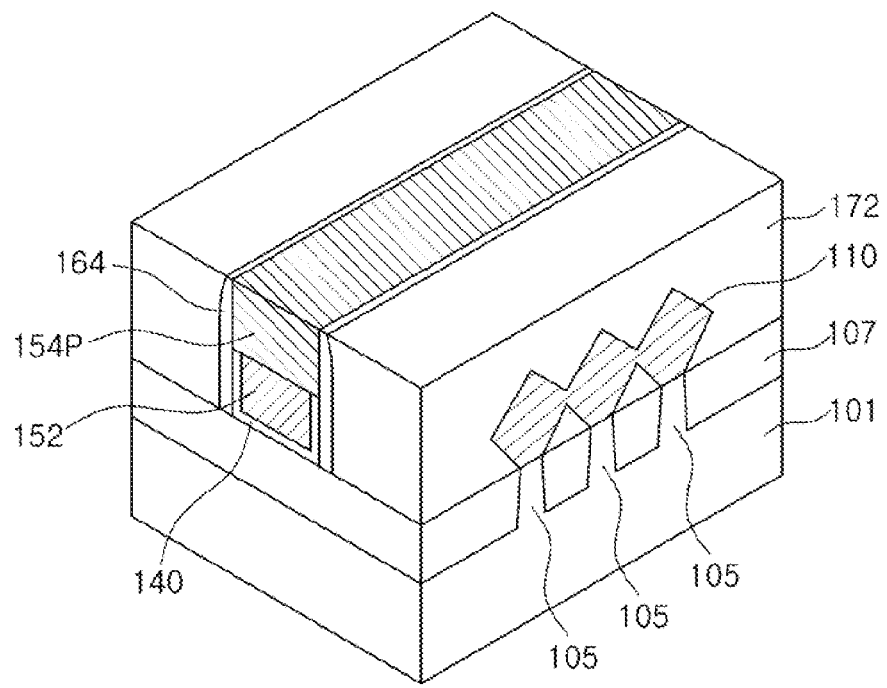
FIGS. 8A through 8C are perspective views illustrating a method of manufacturing a semiconductor device according to example embodiments of inventive concepts.
Figure 8B:
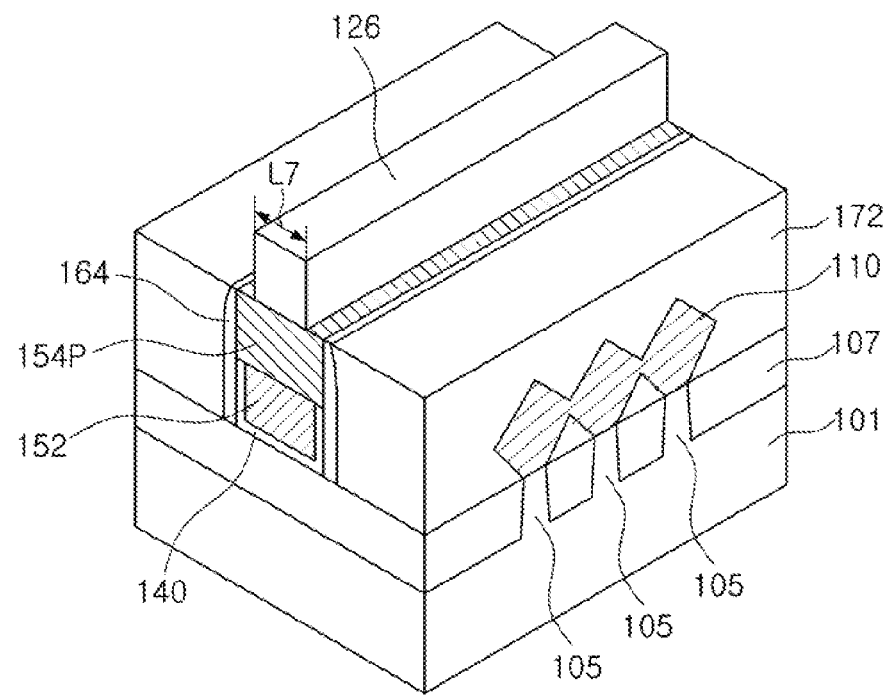
Figure 8C:
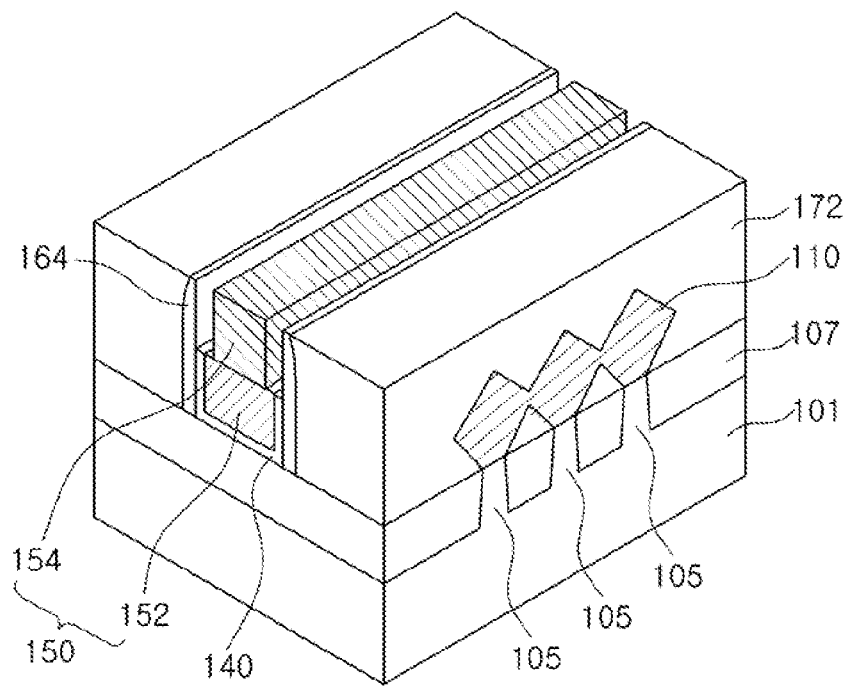

FIGS. 8A through 8C are perspective views illustrating a method of manufacturing a semiconductor device according to example embodiments of inventive concepts. For convenience of description, some of explanation which is substantially the same description described above referring to FIGS. 7A through 7L will be omitted.

Referring to FIG. 8A, a second preliminary gate electrode 154P may be formed on the gate dielectric layer 140 and the first gate electrode 152 after FIG. 7I. More specifically, the second preliminary gate electrode 154P may fill the second opening E2 shown in FIG. 7I.

Referring to FIG. 8B, a mask layer 126 extending in the second direction may be formed on the second preliminary gate electrode 154P. Both side end portions of the second preliminary gate electrode 154P may be exposed by the mask layer 126. The mask layer 126 may include a photoresist layer. However, it shall not be restricted or limited thereto. The mask layer 126 may have a width L7 less than the width L1 (See FIG. 1) of the first gate electrode 152 in a cross-sectional view.

Referring to FIG. 8C, the both side end portions of the second preliminary gate electrode 154P may be removed to form a second gate electrode 154 having a width less than the width L1 of the first gate electrode 152. The mask layer 126 may be removed after forming the second gate electrode 154.

In example embodiments, a first spacer 162 may be formed after forming the second gate electrode 154. For example, the first spacer 162 may be formed by filling a dielectric layer on both sides of the second gate electrode 154 (refer FIG. 7K).

Alternatively, the second gate electrode and the first spacer (see 162 in FIG. 1) is formed by oxidizing a portion of the second preliminary gate electrode 154P that is exposed by the mask layer 126 in FIG. 8B, for example, an oxygen plasma or an oxygen-implant process.

Figure 9A:
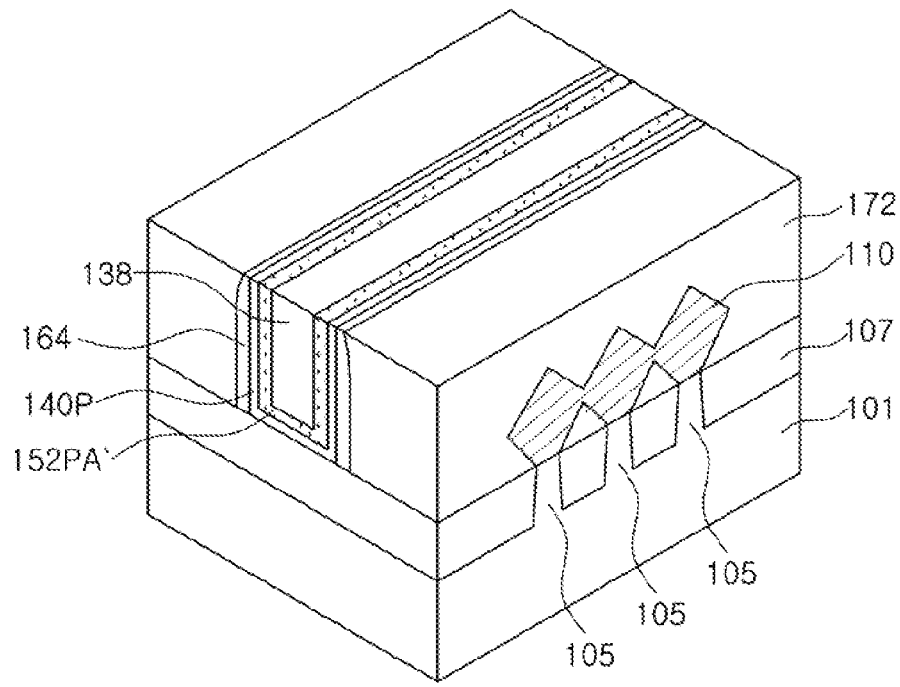
FIGS. 9A through 9C are perspective views illustrating a method of manufacturing a semiconductor device according to example embodiments of inventive concepts.
Figure 9B:
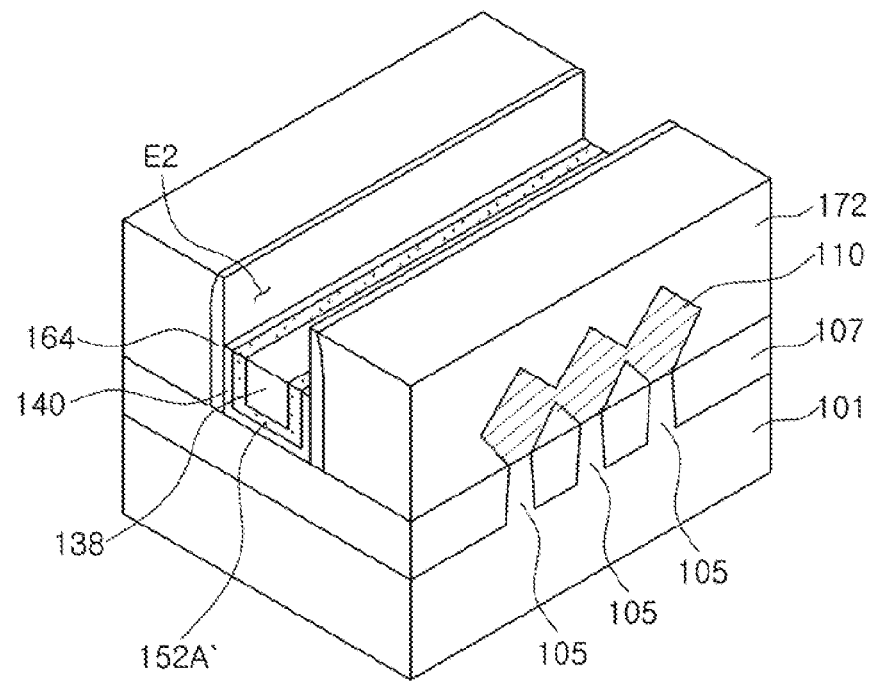
Figure 9C:
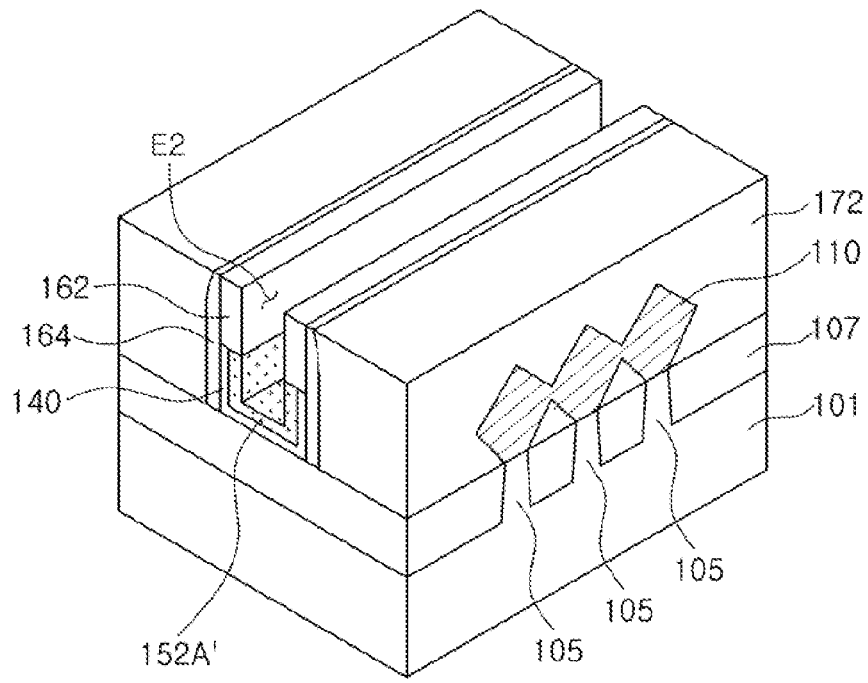

FIGS. 9A through 9C are perspective views illustrating a method of manufacturing a semiconductor device according to example embodiments of inventive concepts. For convenience of description, some of explanation which is substantially the same description described above referring to FIGS. 7A through 7L will be omitted.

Referring to FIG. 9A, a preliminary gate dielectric layer 140P, a preliminary first conductive layer 152PA', and a third sacrificial layer 138 may be formed in the first opening E1 after FIG. 7G.

The preliminary gate dielectric layer 140P and the preliminary first conductive layer 152PA' may be conformally formed along both sidewalls and a bottom of the first opening E1. The preliminary gate dielectric layer 140P may include silicon oxide, silicon nitride, and/or a high-k material. The preliminary first conductive layer 152PA' may include metal and/or metal compounds. The third sacrificial layer 138 may have an etching selectivity with respect to the preliminary gate dielectric layer 140P, the preliminary first conductive layer 152PA', and the second spacer 164.

The preliminary gate dielectric layer 140P, the preliminary first conductive layer 152PA', and the third sacrificial layer 138 may be planarized to exposed an upper surface of the first interlayer insulating layer 172 using a CMP process.

Referring to FIG. 9B, upper portions of the preliminary gate dielectric layer 140P and the preliminary first conductive layer 152PA' may be recessed to form a gate dielectric layer 140 and a first conductive layer 152A' using an etch-back process.

In example embodiments, the third sacrificial layer 138 may be simultaneously recessed during the etch-back process. A second opening E2 may be formed on the gate dielectric layer 140 and a first conductive layer 152A' after the etch-back process. However, it shall not be restricted or limited thereto. For example, the third sacrificial layer 138 may not be recessed during the etch-back process.

Referring to FIG. 9C, a first spacer 162 may be formed on both sidewalls of the second opening E2. A sidewall of the first spacer 162 may contact a sidewall of the second spacer 164 that is exposed by the second opening E2. A thickness of the first spacer 162 may be substantially the same as the sum of the thicknesses of the gate dielectric layer 140 and the first conductive layer 152A' on a sidewall of the second spacer 164. However, it shall not be restricted or limited thereto. The third sacrificial layer 138 may be removed after forming the first spacer 162.

Referring to FIG. 4 again, a second conductive layer 152B' on the first conductive layer 152A'. A first gate electrode 152' may be formed of the first conductive layer 152A' and the second conductive layer 152B'. A second gate electrode 154 may be formed on the first gate electrode 152'. In example embodiments, the second conductive layer 152B' and the second gate electrode 154 may be simultaneously formed of same material.

Figure 10A:
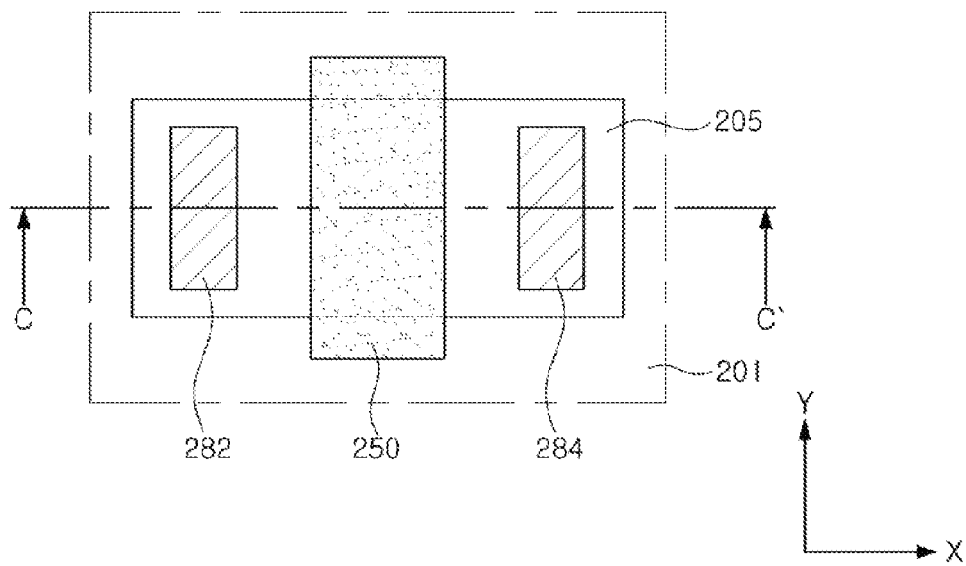
FIG. 10A is a plan view illustrating a semiconductor device according to example embodiments of inventive concepts.
Figure 10B:
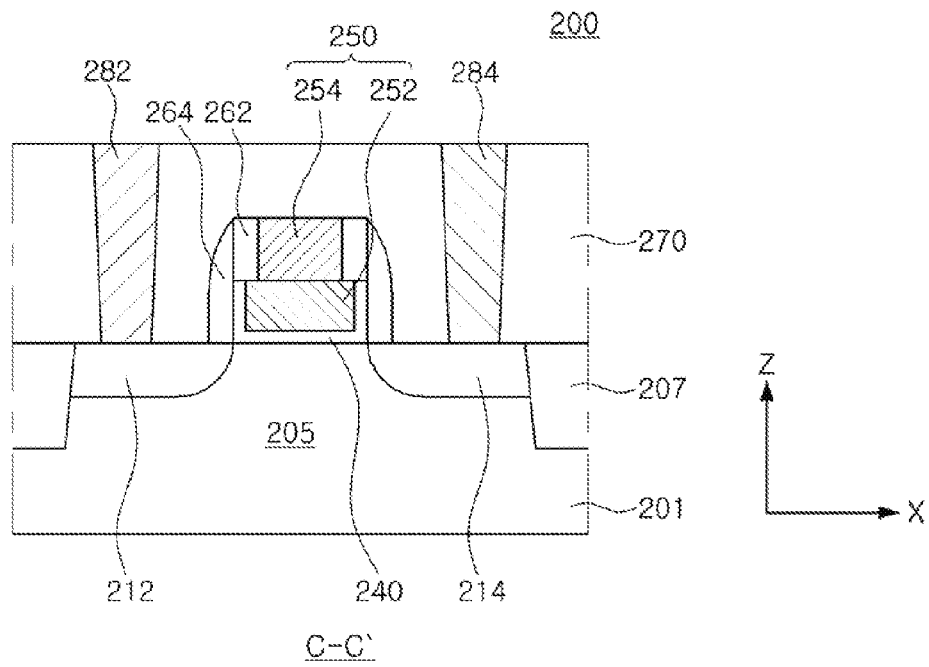
FIG. 10B is a cross-sectional view taken along the line C-C' of FIG. 10A.

FIG. 10A is a plan view illustrating a semiconductor device according to example embodiments of inventive concepts. FIG. 10B is a cross-sectional view taken along the line C-C' of FIG. 10A.

Referring to FIGS. 10A and 10B, a semiconductor device 200 may include a substrate 201, an active region 205, a first source/drain region 212, a second source/drain 214, a gate dielectric layer 240, a gate electrode 250, a first contact plug 282, and a second contact plug 284. The semiconductor device 200 may further include a device isolation region 207, a first spacer 262, a second spacer 264, and an interlayer insulating layer 270. The active region 205 extending in X-direction may be formed on the substrate 201. The gate electrode 250 extending in Y-direction may be formed on the active region 205. The semiconductor device 200 may include a planar type transistor.

The substrate 201 may have an upper surface extending in the X-direction and the Y-direction. The substrate 201 may include a semiconductor material, e.g., a group IV compound semiconductor, a group III-V compound semiconductor, or a group II-VI silicon-oxide semiconductor. For example, the group IV compound semiconductor may include silicon (Si), germanium (Ge), and/or silicon germanium (SiGe). The substrate 101 may be a bulk silicon wafer, an epitaxial layer, a silicon-on-insulator (501) substrate, or a semiconductor-on-insulator (SeOI) substrate.

The device isolation region 207 may define the active region 205 on the substrate 201. The device isolation region 207 may include a dielectric material, e.g., silicon oxide, silicon nitride, or the mixture thereof. The device isolation region 207 may be formed using a shallow trench isolation (STI) process.

The active region 205 may be extended in the X-direction and defined by the device isolation region 207.

The first and second source/drain regions 212 and 214 may be formed at both sides of the gate electrode 250 and in the active region 205. The first and second source/drain regions 212 and 214 may have elevated structures. Therefore, upper surfaces of the first and second source/drain regions 212 and 214 may be higher than a bottom surface of the gate electrode 250.

The gate dielectric layer 240 and the gate electrode 250 crossing the active region 205 may be formed on the active region 205. The gate electrode 250 may include a first gate electrode 252 and a second gate electrode 254 which are stacked on each other. The gate dielectric layer 240 may include an insulating layer, e.g., a silicon oxide layer, a silicon oxynitride layer, and/or a silicon nitride layer.

The first and second gate electrodes 252 and 254 may be extended in the Y-direction. The first and second gate electrodes 252 and 254 may have different widths in the X-direction and include different material from each other. For example, the second gate electrode 254 may include a material having a lower resistivity less than that of the first gate electrode 252.

The first spacer 262 may be formed on both sides of the second gate electrode 254. The second spacer 264 may be formed on both sides of the first and second gate electrodes 252 and 254. In example embodiments, an inner sidewall of the second spacer 264 may contact sidewalls of the gate dielectric layer 240 and the first spacer 262. The first and second spacers 262 and 264 may include silicon oxide, silicon nitride, and/or silicon oxynitride, respectively. In example embodiments, the first and second spacers 262 and 264 may include multiple layers, respectively.

The interlayer insulating layer 270 may be formed on the substrate 201, the first and second source/drain regions 212 and 214, and the gate electrode 250. The interlayer insulating layer 270 may include silicon oxide, silicon nitride, and/or silicon oxynitride.

The first and second contact plugs 282 and 284 may be formed on the first and second source/drain region 212 and 214, respectively. In example embodiments, first and second conductive lines may be formed on the first and second contact plugs 282 and 284, respectively. The first and second contact plugs 282 and 284 may include a conductive material, e.g., aluminum (Al), copper (Cu), and/or tungsten (W).

In example embodiments, the semiconductor 200 may include a vertical structured transistor having a vertical channel region.

Figure 11:
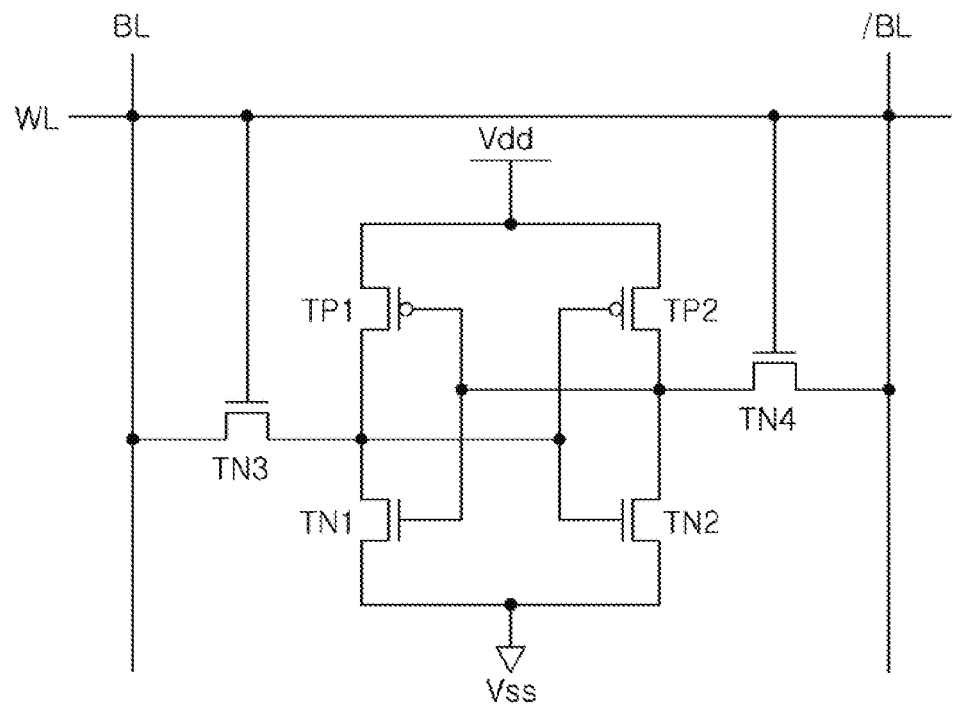
FIG. 11 is a circuit diagram illustrating a SRAM (Static Random Access Memory) unit cell according to example embodiments of inventive concepts.

FIG. 11 is a circuit diagram illustrating a SRAM (Static Random Access Memory) cell according to example embodiments of inventive concepts.

Referring to FIG. 11, the SRAM cell may have a first inverter and a second inverter which are formed between a power supply node Vdd and a ground node Vss. The first inverter, having an input node and an output node, may comprise a first pull-up transistor TP1 and a first pull-down transistor TN1. The second inverter, having an input node and an output node, may have a second pull-up transistor TP2 and a second pull-down transistor TN2. The input node of the first inverter may be connected to a source/drain region of a second pass transistor TN4 as well as to the output node of the second inverter. The input node of second inverter may be connected to a source/drain region of a first pass transistor TN4 as well as to the output node of the first inverter. Gate electrodes of the first and second pass transistors TN3 and TN4 may be connected to a word line WL. A bit line BL may be connected to a source/drain region of the first pass transistor TN3. A bit line bar/BL may be connected to a source/drain region of the second pass transistor TN4. The first and second pull-up transistors TP1 and TP2 may be PMOS transistors. The first and second pull-down transistors TN1 and TN2 and the first and second pass transistors TN3 and TN4 may be NMOS transistors. The first and second pull-up transistors TP1 and TP2 may be formed according to example embodiments of inventive concepts.

Figure 12:
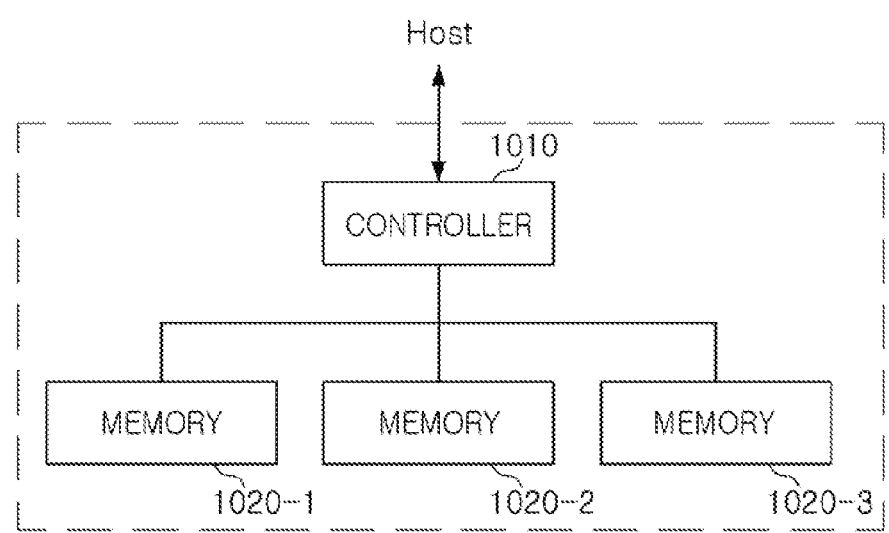
FIG. 12 is a block diagram illustrating a storage device including a semiconductor device according to example embodiments of inventive concepts.

FIG. 12 is a block diagram of a storage device including a semiconductor device according to example embodiments of inventive concepts.

Referring to FIG. 12, a storage apparatus 1000 according to example embodiments of inventive concepts may include a controller 1010 communicating with a Host, and memories 1020-1, 1020-2 and 1020-3 storing data. The respective memories 1020-1, 1020-2 and 1020-3 may include one of the semiconductor devices according to example embodiments of inventive concepts described with reference to FIGS. 1 through 10B.

Examples of the host communicating with the controller 1010 may include various electronic devices on which the storage apparatus 1000 is mounted. For example, the host may be, for example, a smartphone, a digital camera, a desktop computer, a laptop computer, a portable media player or the like. The controller 1010 may receive a data writing or reading request transferred from the host to store data in the memories 1020-1, 1020-2 and 1020-3 or generate a command for retrieving data from the memories 1020-1, 1020-2 and 1020-3.

As illustrated in FIG. 12, at least one or more memories 1020-1, 1020-2 and 1020-3 may be connected to the controller 1010 in parallel in the storage apparatus 1000. The plurality of memories 1020-1, 1020-2 and 1020-3 may be connected to the controller 1010 in parallel, whereby the storage apparatus 1000 having high capacity such as a solid state drive may be implemented.

Figure 13:
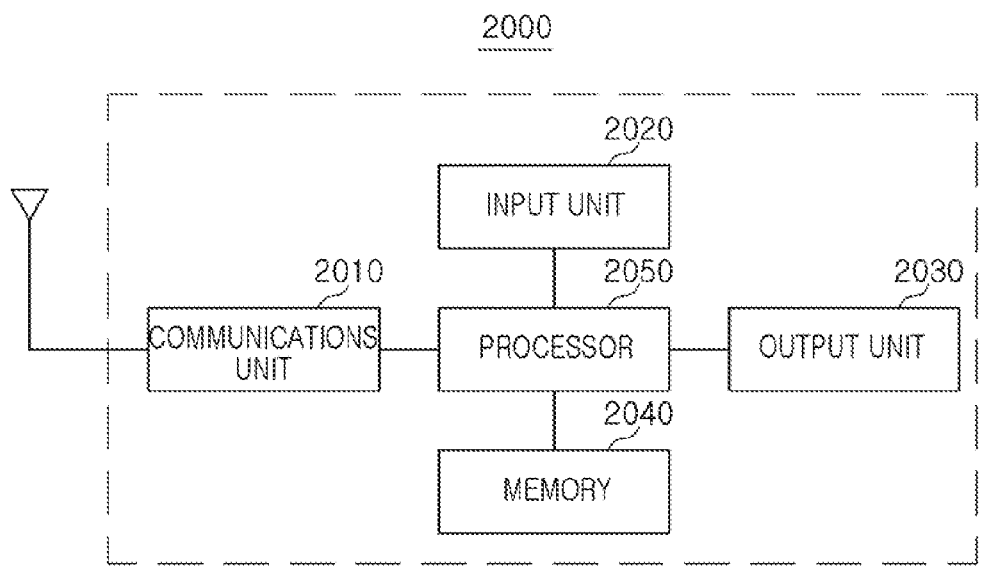
FIG. 13 is a block diagram illustrating an electronic device including a semiconductor device according to example embodiments of inventive concepts.

FIG. 13 is a block diagram of an electronic device including a semiconductor device according to example embodiments of inventive concepts Referring to FIG. 13, an electronic apparatus 2000 according to example embodiments may include a communications unit 2010, an input unit 2020, an output unit 2030, a memory 2040, and a processor 2050.

The communications unit 2010 may include a wired or wireless communications module, a wireless Internet module, a local area communications module, a global positioning system (GPS) module, a mobile communications module and the like. The wired or wireless communications module included in the communications unit 2010 may be connected to external communications networks according to various communications standard specification to transmit and receive data.

The input unit 2020 may be a module provided to control an operation of the electronic apparatus 2000 by a user and may include a mechanical switch, a touch screen, a voice recognition module, and the like. In addition, the input unit 2020 may include a mouse operating in a track ball or a laser pointer scheme or a finger mouse device. In addition to these, the input unit 2020 may further include various sensor modules allowing for a user to input data thereto.

The output unit 2030 may output information processed in the electronic apparatus 2000 in a sound or image form, and the memory 2040 may store programs for the processing and the control of the processor 2050. The memory 2040 may include at least one semiconductor device according to various example embodiments of inventive concepts as described with reference to FIGS. 1 through 10B. The processor 2050 may transfer a command to the memory 2040 according to a required operation to thereby store or retrieve data.

The memory 2040 may be embedded in the electronic apparatus 2000 to communicate with the processor 2050 or communicate with the processor 2050 through a separate interface. In a case in which the memory 2040 communicates with the processor 2050 through a separate interface, the processor 2050 may store or retrieve data, through various interface standards such as SD, SDHC, SDXC, MICRO SD, USB and the like.

The processor 2050 may control operations of respective components included in the electronic apparatus 2000. The processor 2050 may perform control and processing in association with voice communications, video telephony, data communications and the like, or may perform control and processing for multimedia reproduction and management. In addition, the processor 2050 may process an input transferred from a user through the input unit 2020 and may output results thereof through the output unit 2030. In addition, the processor 2050 may store data required in controlling the operation of the electronic apparatus 2000 as described above, in the memory 2040, or fetch data from the memory 2040.

Figure 14:
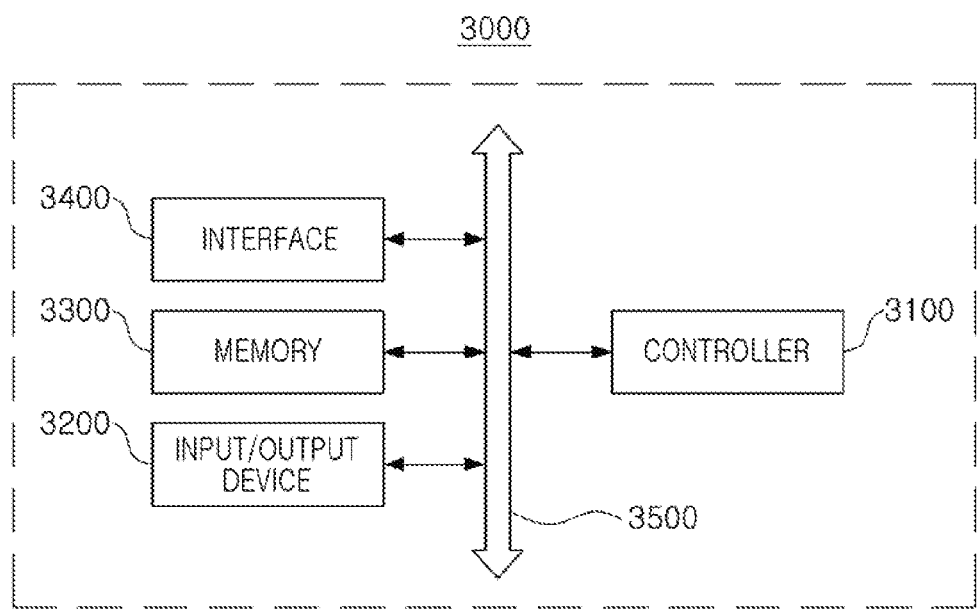
FIG. 14 is a block diagram illustrating a system including a semiconductor device according to example embodiments of inventive concepts.

FIG. 14 is a block diagram of a system including a semiconductor device according to example embodiments of inventive concepts.

Referring to FIG. 14, a system 3000 may include a controller 3100, an input/output device 3200, a memory 3300, and an interface 3400. The system 3000 may transmit or receive mobile system or information. Examples of the mobile system may include PDAs, portable computers, web tablets, wireless phones, mobile phones, digital music players and memory cards.

The controller 3100 may execute a program and control the system 3000. The controller 3100 may be a microprocessor, a digital signal processor, a microcontroller or device similar thereto.

The input/output device 3200 may be used to input or output data to or from the system 3000. The system 3000 may be connected to an external device, for example, a personal computer or networks and may exchange data with the external device. The input/output device 3200 may be a keypad, a keyboard, or a display device.

The memory 3300 may store a code and/or data for operating the controller 3100 and/or store data having been processed by the controller 3100. The memory 3300 may include the semiconductor device according to one of the example embodiments of inventive concepts.

The interface 3400 may be a data transmission path between the system 3000 and an external device. The controller 3100, the input/output device 3200, the memory 3300, and the interface 3400 may be in communication with one another via a bus 3500.

At least one of the controller 3100 or the memory 3300 may include at least one of the semiconductor devices described with reference to FIGS. 1 through 10B.

The above-disclosed subject matter is to be considered illustrative and not restrictive, and the appended claims are intended to cover all such modifications, enhancements, and other embodiments, which fall within the true spirit and scope of inventive concepts. Descriptions of features or aspects within each device or method according to example embodiments should typically be considered as available for other similar features or aspects in other devices or methods according to example embodiments. Thus, the scope of inventive concepts is to be determined by the broadest permissible interpretation of the following claims and their equivalents, and shall not be restricted or limited by the foregoing detailed description.

What is claimed is:

1. A semiconductor device, comprising:
   a substrate;
   an active region extending in a first direction on the substrate;
   a first gate electrode on the substrate, the first gate electrode crossing the active region and extending in a second direction, the first gate electrode having a first width in the first direction; and
   a second gate electrode on the first gate electrode, the second gate electrode extending in the second direction, the second gate electrode having a second width in the first direction, the second width being less than the first width; and
   a gate dielectric layer covering the both sides of the first gate electrode,
   wherein a bottom of the first gate electrode is on the gate dielectric layer.

2. The semiconductor device of claim 1, wherein the first gate electrode includes a different material than a material of the second gate electrode.

3. The semiconductor device of claim 1, wherein the second gate electrode includes a material having a resistivity that is less than a resistivity of the first gate electrode.

4. The semiconductor device of claim 1, further comprising:
   a first spacer on the first gate electrode, wherein the first spacer is positioned at both sides of the second gate electrode.

5. The semiconductor device of claim 1, wherein an uppermost surface of the gate dielectric layer is below the second gate electrode.

6. The semiconductor device of claim 1, further comprising:
   a first spacer on an upper surface of the first gate electrode; and
   a second spacer on the substrate, wherein
   the first spacer is positioned at both sides of the second gate electrode between the second spacer and the second gate electrode,
   a portion of the gate dielectric layer is between the second spacer and the first gate electrode, and
   an uppermost surface of the gate dielectric layer contacts a bottom of the first spacer.

7. The semiconductor device of claim 1, wherein
   the first gate electrode includes a first conductive layer and a second conductive layer,
   the first conductive layer includes a first portion and a second portion,
   the first portion extends parallel to an upper surface of the substrate, and
   the second portion extends in a vertical direction from the upper surface of the substrate.

8. The semiconductor device of claim 7, wherein at least one of the first and second conductive layers has a line shape extending in a direction.

9. The semiconductor device of claim 7, wherein the second gate electrode includes substantially the same material as at least one of the first and second conductive layers.

10. The semiconductor device of claim 1, further comprising:
    a source/drain region on the active region at both sides of the first and second gate electrodes, the source/drain region including a silicon germanium epitaxial layer; and
    a contact plug on the source/drain region.

11. The semiconductor device of claim 1, wherein the active region includes a fin-type active region.

12. A semiconductor device, comprising:
    a substrate having an active region;
    a first gate electrode on the active region;
    a gate dielectric layer between the active region and the first gate electrode, a portion of the gate dielectric layer extending along a sidewall of the first gate electrode;
    a second gate electrode on the first gate electrode; and
    a first spacer positioned at a sidewall of the second gate electrode, the first spacer being on an upper portion of the first gate electrode.

13. The semiconductor device of claim 12, wherein a bottom surface of the first spacer contacts an upper surface of the gate dielectric layer.

14. The semiconductor device of claim 12, further comprising:
    a second spacer on the substrate at a sidewall of the first spacer, wherein
    a lower portion of the second spacer contacts a sidewall of the gate dielectric layer,
    the first gate electrode has a first width, and
    the second gate electrode has a second width that is less than the first width.

15. A semiconductor device, comprising:
    a substrate;
    an active region extending in a first direction on the substrate, the active region being one of formed on the substrate and defined by trenches formed in the substrate;
    a first gate electrode on the active region, the first gate electrode extending in a second direction that crosses the first direction;
    a gate dielectric layer between the first gate electrode and the active region;
    a first spacer including two first spacer structures on top of an upper surface of the first gate electrode and spaced apart from each other in the first direction; and
    a second gate electrode on the first gate electrode between the two first spacer structures.

16. The semiconductor device of claim 15, further comprising:
    a second spacer on the active region, wherein
    the second spacer includes two second spacer structures spaced apart from each other in the first direction, and
    the first spacer structures, the gate dielectric layer, the first gate electrode, and the second gate electrode are between the two second spacer structures.

17. The semiconductor device of claim 16, wherein a dielectric constant of the first spacer is less than a dielectric constant of the second spacer.

18. The semiconductor device of claim 15, wherein
    the two first spacer structures are in direct contact with an upper surface of the gate dielectric layer, or
    the two first spacer structures are in direct contact with a side surface of the gate dielectric layer.

19. The semiconductor device of claim 15, wherein the active region includes a fin-type active region.

* * * * *